(12) United States Patent  
Endo

(10) Patent No.: US 7,746,143 B2  
(45) Date of Patent: Jun. 29, 2010

(54) CLOCK GENERATING CIRCUIT AND SEMICONDUCTOR DEVICE PROVIDED WITH CLOCK GENERATING CIRCUIT

(75) Inventor: Masami Endo, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 119 days.

(21) Appl. No.: 11/984,463

(22) Filed: Nov. 19, 2007

(65) Prior Publication Data

US 2008/0258793 A1    Oct. 23, 2008

(30) Foreign Application Priority Data

Nov. 30, 2006    (JP) .............................. 2006-323948

(51) Int. Cl.
*H03K 3/013* (2006.01)
(52) U.S. Cl. ...................... 327/292; 327/291; 327/293; 327/294
(58) Field of Classification Search ................. 327/291, 327/292, 293, 294
See application file for complete search history.

(56) References Cited

U.S. PATENT DOCUMENTS 5,208,833 A    5/1993    Erhart et al.
6,559,696 B1    5/2003    Heitmann et al.
7,250,803 B2 *    7/2007    Kazuma ...................... 327/291
2008/0012616 A1    1/2008    Endo et al.
2008/0054976 A1    3/2008    Endo et al.

FOREIGN PATENT DOCUMENTS

JP    2003-006592    1/2003
JP    2003-0069891    3/2003
JP    2004-288512    10/2004

* cited by examiner

*Primary Examiner*—Lincoln Donovan
*Assistant Examiner*—John W Poos
(74) *Attorney, Agent, or Firm*—Eric J. Robinson; Robinson Intellectual Property Law Office, P.C.

(57) ABSTRACT

An object is to provide a clock generating circuit that can suppress variation of an oscillation frequency from the clock generating circuit, which is due to a change in the output voltage according to a discharging characteristic of the battery, and effectively utilize the remaining power of the battery. A structure includes an output voltage detecting circuit for detecting an output voltage from a battery; a frequency-division number determining circuit for determining the number of frequency-division by a value of the output voltage detected by the output voltage detecting circuit; an oscillation circuit for outputting a reference clock signal depending on the output voltage; a counter circuit for counting a number of waves of the reference clock signal that depends on the number of frequency-division; and a frequency-dividing circuit that frequency-divides the reference clock signal depending on the number of waves counted by the counter circuit.

12 Claims, 23 Drawing Sheets

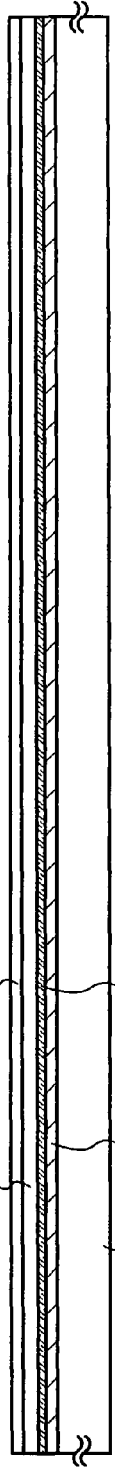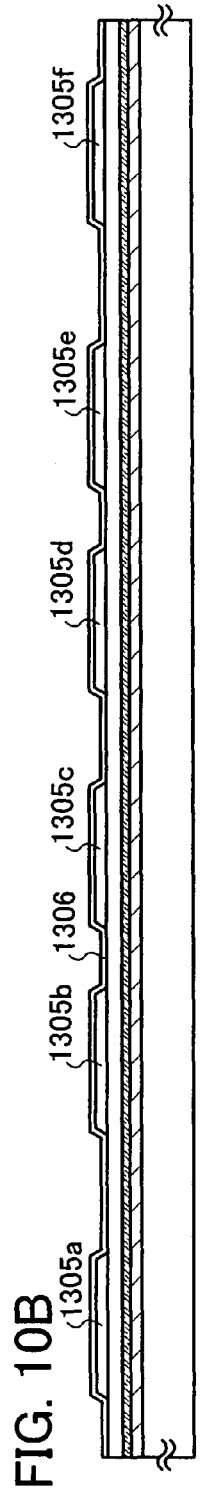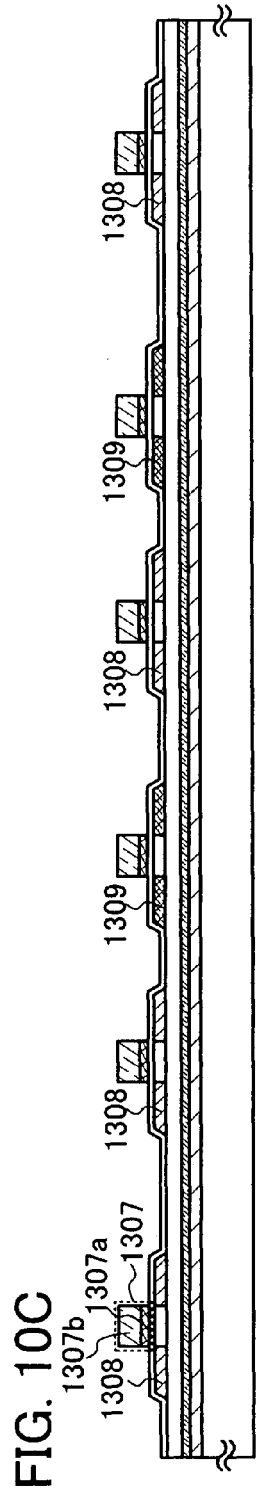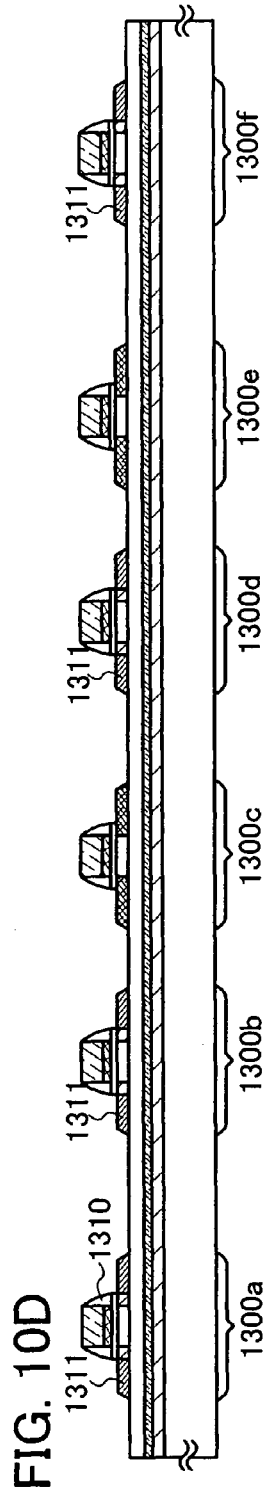

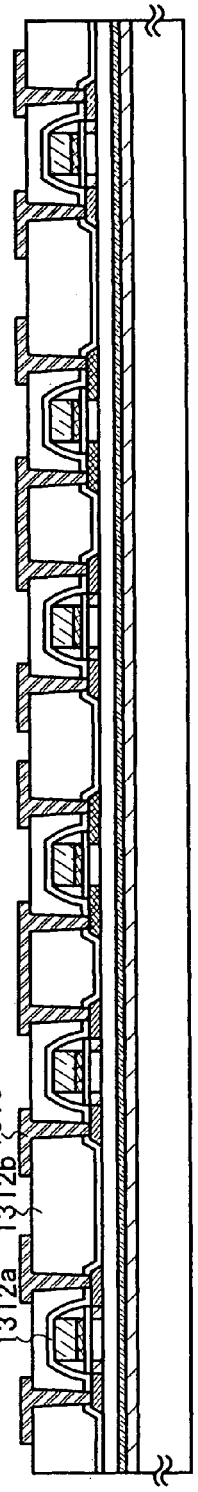
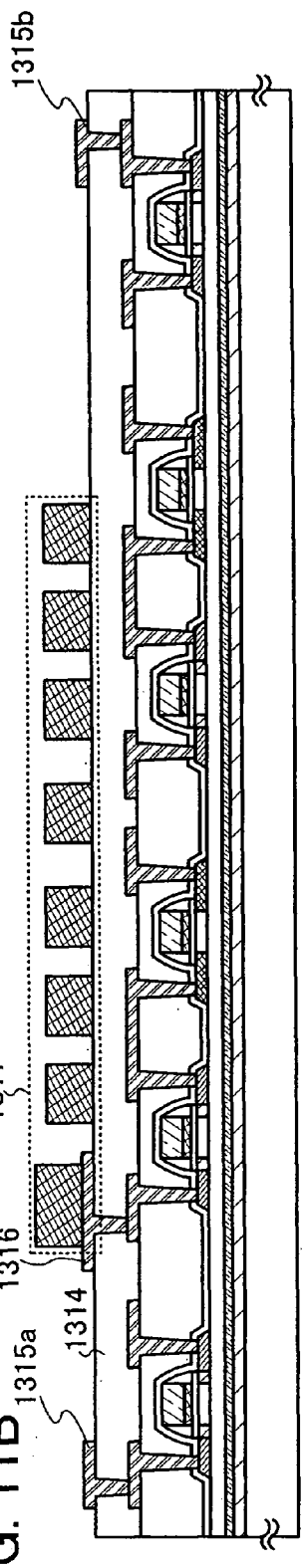
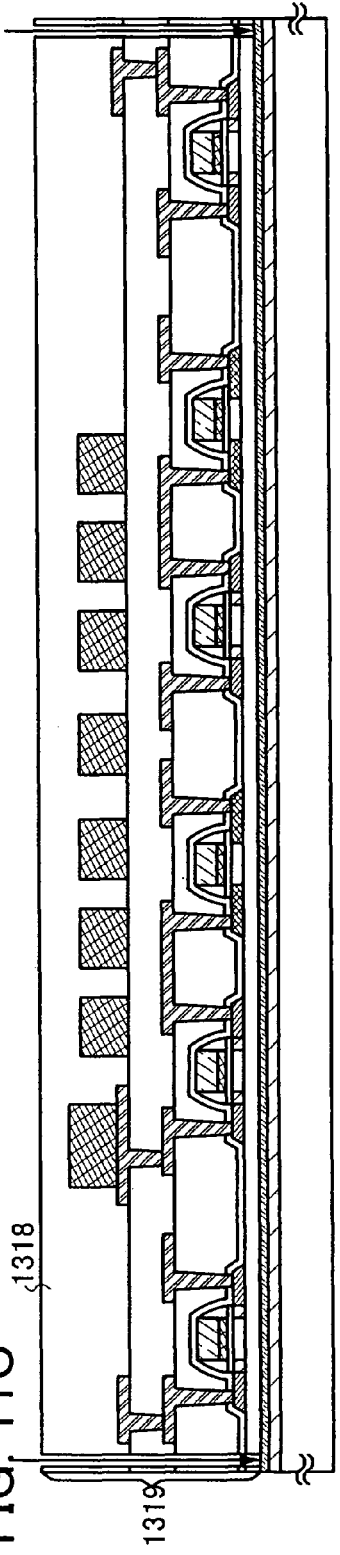
FIG. 11A  
FIG. 11B  
FIG. 11C

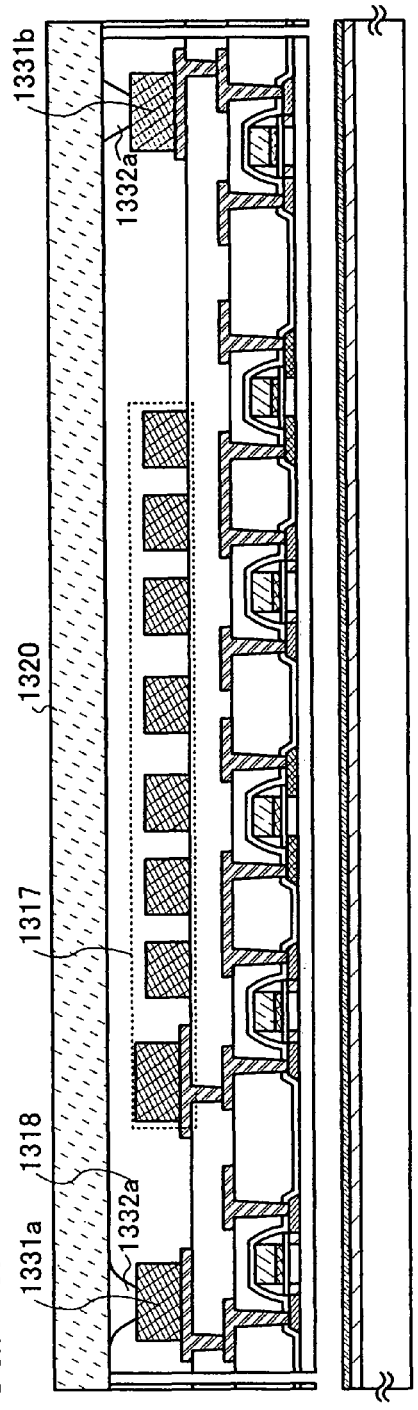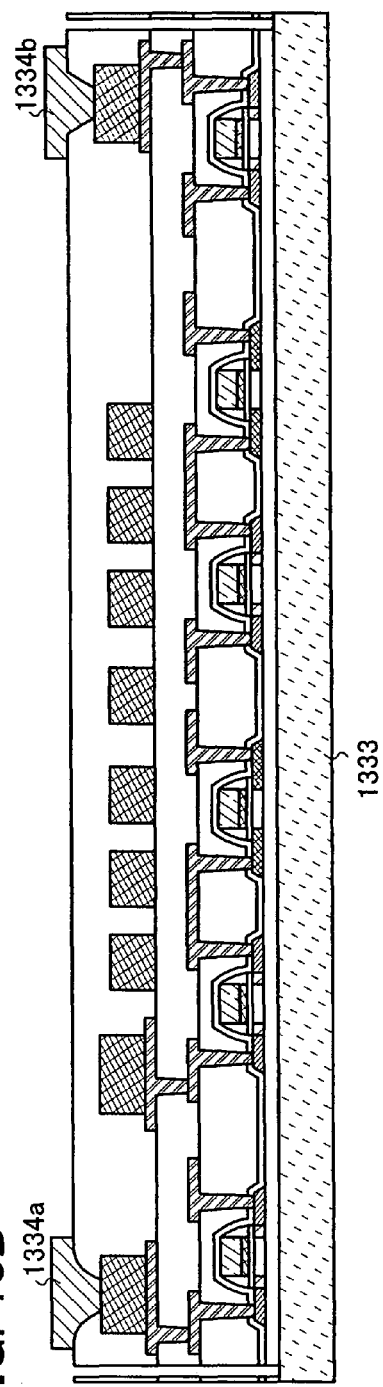

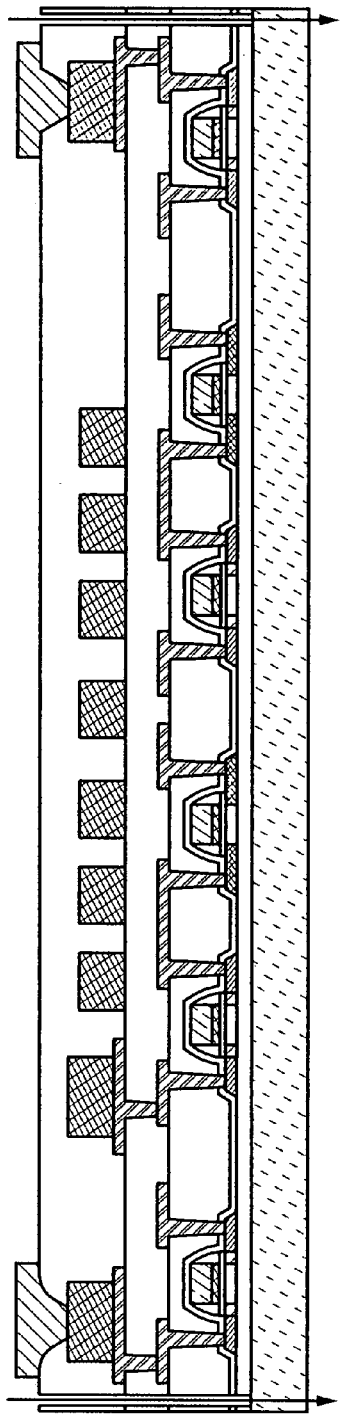
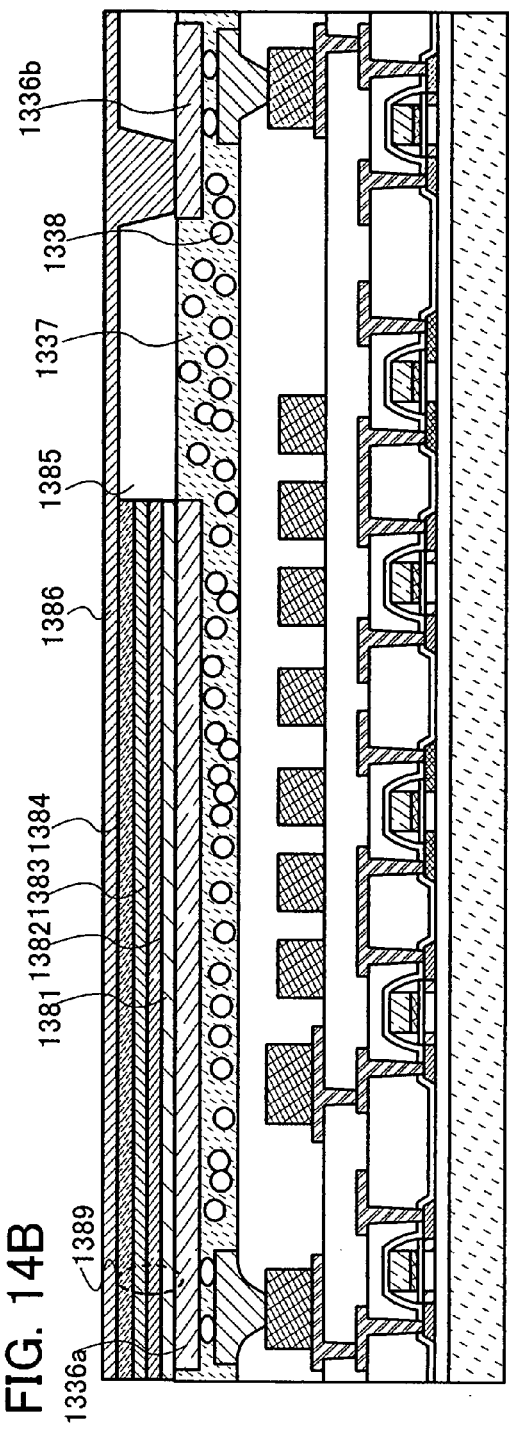

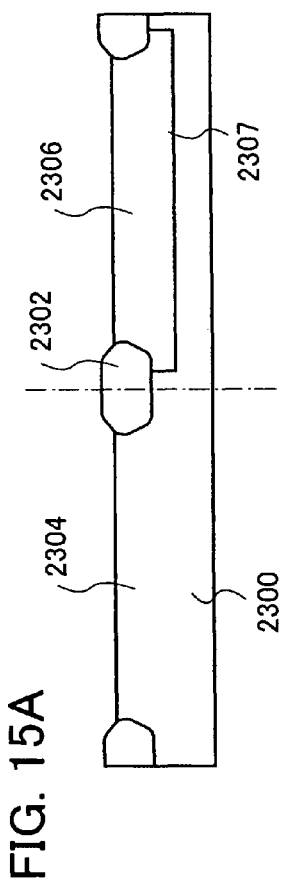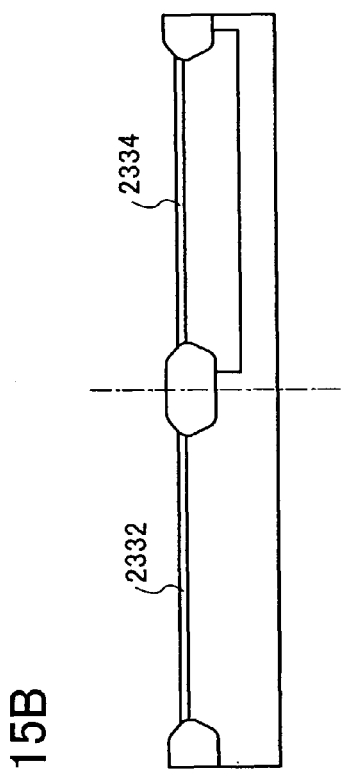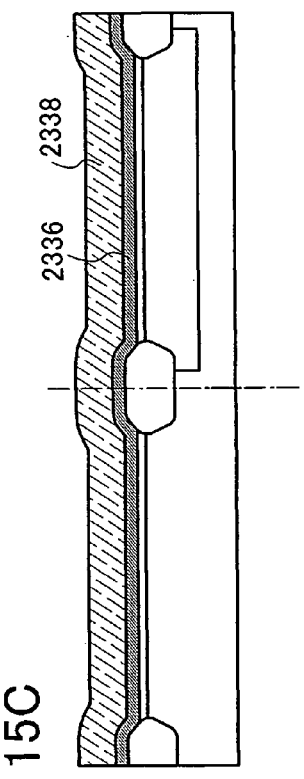

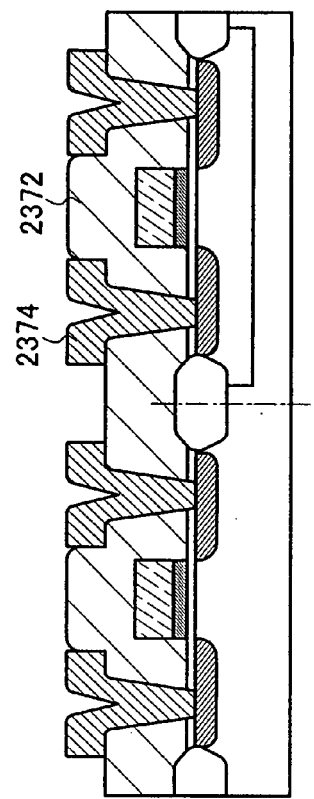
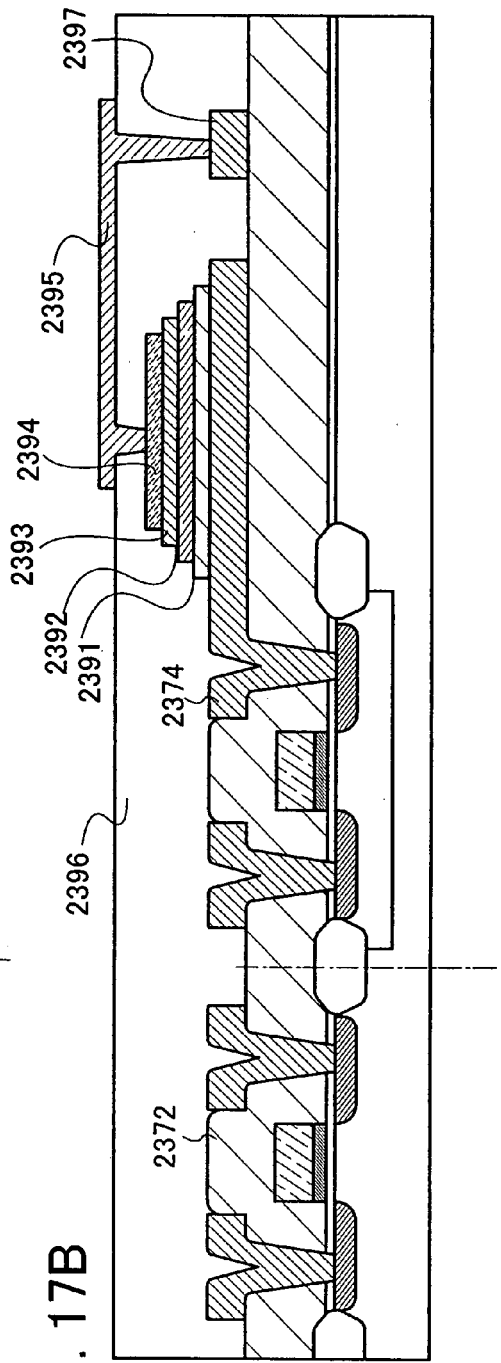
FIG. 17A
FIG. 17B

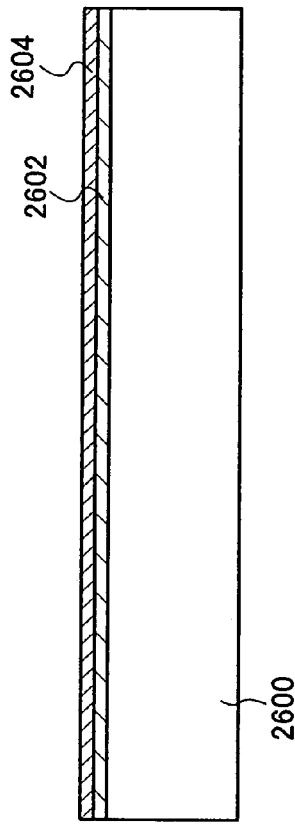
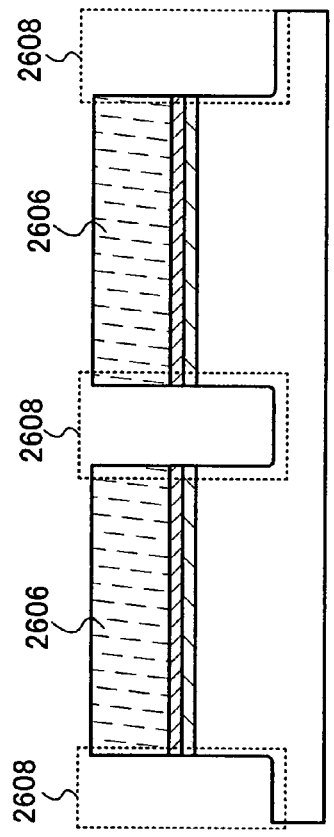
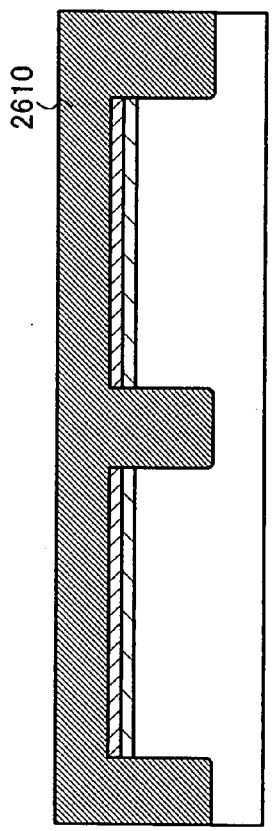

FIG. 22A
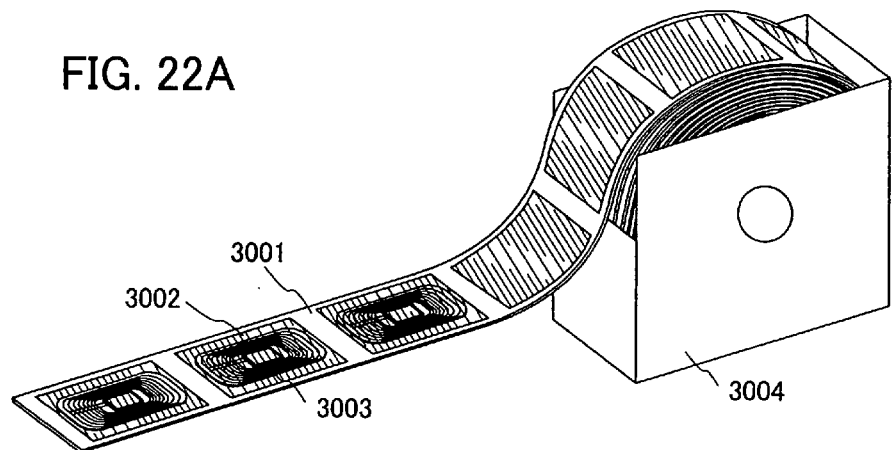
FIG. 22B
FIG. 22C
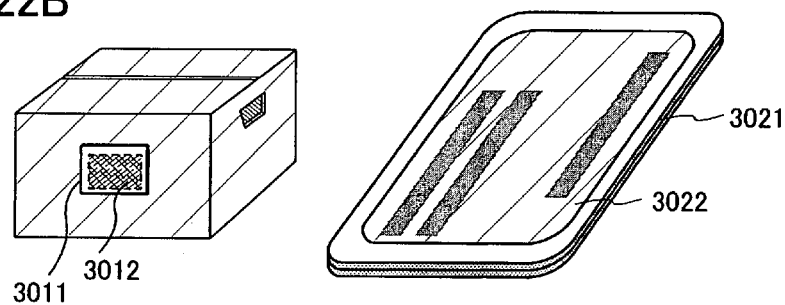
FIG. 22D
FIG. 22E
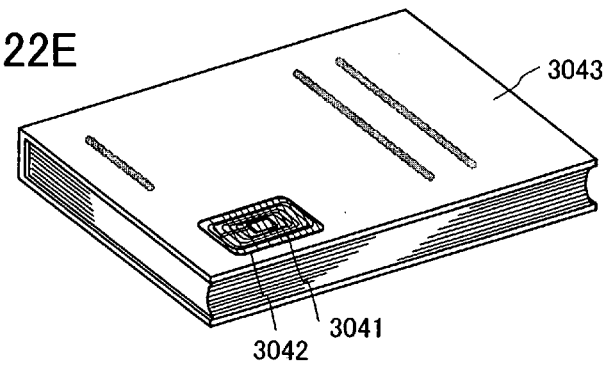

CLOCK GENERATING CIRCUIT AND SEMICONDUCTOR DEVICE PROVIDED WITH CLOCK GENERATING CIRCUIT

BACKGROUND OF THE INVENTION

1. Field of the Invention

The present invention relates to a clock generating circuit. The present invention particularly relates to a clock generating circuit that generates a clock signal depending on an output voltage from a battery, and can steadily generate a clock signal of a desirable frequency even if the output voltage fluctuates due to a discharging characteristic of the battery. The present invention also relates to a semiconductor device provided with the clock generating circuit.

2. Description of the Related Art

Various electronic appliances have spread, and a variety of products is shipped to the market. The spread of portable electronic appliances is particularly notable. For example, the resolutions of the display portions and decay durability of the batteries have been improved for portable telephones, digital cameras, and the like, and their power consumption have been reduced, which makes them more convenient. Power for driving a portable electronic appliance is secured by a battery that is a storage means, which is incorporated in a structure of the portable electronic appliance. As the battery, a battery such as a lithium ion battery is used.

As an example of a portable electronic appliance, research and development for practical application of RFID (radio frequency identification) tags (hereinafter called "RF tags") have been actively pursued. RF tags can be classified into two types: an active type and a passive type. The active type includes a battery and can transmit an electromagnetic wave containing information of an RF tag. Also, separately from the active type RF tag, the development of a technique for charging a battery for securing power for driving an RF tag using electromagnetic wave generated from a portable phone or the like (see Patent Document 1: Japanese Published Patent Application No. 2003-6592) has been in progress.

Note that an RF tag is also called an IC (integrated circuit) tag, an IC chip, an RF chip, a wireless tag, or an electronic tag.

On the other hand, since a discharging characteristic of a battery is degraded over time, the development of a technique for efficiently utilizing a remaining amount of power in the battery has been in progress (see Patent Document 2: Japanese Published Patent Application No. 2003-69891). This is done by detecting the remaining amount of power in the battery when an output voltage of the battery becomes lower, and having a plurality of modes for changing a driving frequency for driving an electronic appliance.

SUMMARY OF THE INVENTION

An output voltage of the battery becomes lower depending on the discharging time, as shown by the discharging characteristic in FIG. 23A. In FIG. 23A, in a discharging period $t_{all}$, an output voltage right after completion of charging is designated as $V_1$, and the output voltage after a period $t_1$ is designated as $V_2$. After the period $t_1$, a constant output voltage $V_2$ is held in a period $t_2$, and the output voltage becomes $V_3$ after a period $t_3$. After the period $t_3$, the discharging characteristic of the battery is lost.

In a clock generating circuit of an internal circuit in a portable electronic appliance equipped with a battery, reduction in frequency of a clock signal has occurred due to the reduction of the output voltage of the battery from $V_1$ to $V_3$ over time, shown in FIG. 23A. FIG. 23B shows a change in oscillation frequency as the output voltage input to the clock generating circuit changes from $V_1$ to $V_3$. As shown in FIG. 23B, oscillation frequencies in the clock generating circuit varies from $F_1$ to $F_3$ depending on the voltages $V_1$ to $V_3$ that are input.

To solve the problem of variation in oscillation frequency, the output voltage $V_2$ in the period $t_2$ shown in FIG. 23A, in which the remaining amount of power of battery is constant, can be used as the output voltage of the battery. However, the discharging period $t_{all}$ of the battery in FIG. 23A is longer than the period $t_2$, and there is still surplus of the periods $t_1$ and $t_3$.

In order to lengthen a lifetime of a battery, effective utilization of the remaining power of the battery by changing a mode of driving an electronic appliance based on the oscillation frequency of the clock generating circuit can be considered, as it is with the electronic appliance described in Patent Document 2: Japanese Published Patent Application No. 2003-69891. However, varying a driving frequency by changing the mode of driving the electronic appliance also leads to a problem of degradation of the quality of the electronic appliance.

The clock generating circuit for driving the portable electronic appliance is composed of a ring oscillator or the like. In a ring oscillator, oscillation frequency changes depending on a voltage that is output from the battery; consequently, it is necessary to provide a constant-voltage circuit such as a regulator in an input portion of the ring oscillator. Accordingly, there has been a problem that the clock generating circuit is not able to utilize the remaining power of the battery effectively.

In view of the foregoing problems, an object is to provide a clock generating circuit that can suppress change of an oscillation frequency from the clock generating circuit, which is due to a change in the output voltage according to a discharging characteristic of the battery, and effectively utilize the remaining power of the battery.

In order to achieve the above objective, a clock generating circuit of the present invention has a structure of including an output voltage detecting circuit for detecting an output voltage from a battery; a frequency-division number determining circuit for determining the number of frequency-division by the output voltage detected by the output voltage detecting circuit; an oscillation circuit for outputting a reference clock signal depending on the output voltage; a counter circuit for counting the number of waves of the reference clock signal; and a frequency-dividing circuit that frequency-divides the reference clock signal, wherein the counter circuit outputs a signal for performing a frequency-division with the number of frequency-division determined by the frequency-division number determining circuit when the counted number of waves reaches the number of waves corresponding to the number of frequency-division, after the counter circuit outputs a signal for performing a frequency-division once.

One feature of a clock generating circuit of the present invention includes an output voltage detecting circuit for detecting an output voltage from a battery; a frequency-division number determining circuit for determining the number of frequency-division by the output voltage detected by the output voltage detecting circuit; an oscillation circuit for outputting a reference clock signal depending on the output voltage; a counter circuit for counting a number of waves of the reference clock signal; and a frequency-dividing circuit that frequency-divides the reference clock signal, wherein the counter circuit outputs a signal for performing a frequency-division with the number of frequency-division determined by the frequency-division number determining circuit when the counted number of waves reaches the number of waves corresponding to the number of frequency-division, after the counter circuit outputs a signal for performing a frequency-division once.

Another feature of the present invention is a clock generating circuit including an output voltage detecting circuit for detecting an output voltage from a battery; a frequency-division number determining circuit for determining the number of frequency-division by the output voltage detected by the output voltage detecting circuit; an oscillation circuit for outputting a reference clock signal depending on the output voltage; a counter circuit for counting a number of waves of the reference clock signal; and a frequency-dividing circuit that outputs a signal obtained by frequency-dividing the reference clock signal, as a clock signal, to a logic circuit, wherein the counter circuit outputs a signal for performing a frequency-division with the number of frequency-division determined by the frequency-division number determining circuit when the counted number of waves reaches the number of waves corresponding to the number of frequency-division, after the counter circuit outputs a signal for performing a frequency-division once.

Note that the battery in the clock generating circuit of the present invention may be a primary battery or a secondary battery.

Note that the oscillation circuit in the clock generating circuit of the present invention may be a ring oscillator or a crystal oscillator.

Still another feature of the present invention is a semiconductor device equipped with an antenna and which performs transmission and reception of a signal by wireless communication with a reader/writer, and the semiconductor device includes a clock generating circuit, a logic circuit, and a battery. Further, the clock generating circuit includes an output voltage detecting circuit for detecting an output voltage from a battery; a frequency-division number determining circuit for determining the number of frequency-division by the output voltage detected by the output voltage detecting circuit; an oscillation circuit for outputting a reference clock signal depending on the output voltage; a counter circuit for counting a number of waves of the reference clock signal; and a frequency-dividing circuit that frequency-divides the reference clock signal, wherein the counter circuit outputs a signal for performing a frequency-division with the number of frequency-division determined by the frequency-division number determining circuit when the counted number of waves reaches the number of waves corresponding to the number of frequency-division, after the counter circuit outputs a signal for performing a frequency-division once.

Yet another feature of the present invention is a semiconductor device equipped with an antenna and which performs transmission and reception of a signal by wireless communication with a reader/writer, and the semiconductor device includes a clock generating circuit, a logic circuit, and a battery. Further, the clock generating circuit includes an output voltage detecting circuit for detecting an output voltage from a battery; a frequency-division number determining circuit for determining the number of frequency-division by a value of the output voltage detected by the output voltage detecting circuit; an oscillation circuit for outputting a reference clock signal depending on the output voltage; a counter circuit for counting a number of waves of the reference clock signal; and a frequency-dividing circuit that outputs a signal obtained by frequency-dividing the reference clock signal, as a clock signal, to a logic circuit, wherein the counter circuit outputs a signal for performing a frequency-division with the number of frequency-division determined by the frequency-division number determining circuit when the counted number of waves reaches the number of waves corresponding to the number of frequency-division, after the counter circuit outputs a signal for performing a frequency-division once.

In addition, the battery in the semiconductor device of the present invention may be a primary battery or a secondary battery.

Further, the oscillation circuit in the semiconductor device of the present invention may be a ring oscillator or a crystal oscillator.

By the present invention, a clock generating circuit can be provided that can suppress variation of an oscillation frequency from the clock generating circuit, which is due to a change in the output voltage according to a discharging characteristic of the battery, and effectively utilize the remaining power of the battery. Accordingly, lifetime of the battery can be lengthened without causing degradation in quality of an electronic appliance due to variation in a clock signal.

In addition, the clock generating circuit of the present invention can generate a clock signal with little variation, without providing a constant-voltage circuit such as a regulator circuit in an input portion of the clock generating circuit. Accordingly, for an electronic appliance or the like equipped with the clock generating circuit of the present invention, power consumption can be reduced and miniaturization of the electronic appliance can be achieved.

BRIEF DESCRIPTION OF DRAWINGS

In the following drawings:

FIGS. 10A to 10D show an example of a manufacturing method of a semiconductor device of the present invention;

FIGS. 11A to 11C show an example of a manufacturing method of a semiconductor device of the present invention;

FIGS. 13A and 13B show an example of a manufacturing method of a semiconductor device of the present invention;

FIGS. 14A and 14B show an example of a manufacturing method of a semiconductor device of the present invention;

FIGS. 15A to 15C show an example of a manufacturing method of a semiconductor device of the present invention;

FIGS. 17A and 17B show an example of a manufacturing method of a semiconductor device of the present invention;

FIGS. 18A to 18C show an example of a manufacturing method of a semiconductor device of the present invention;

FIGS. 22A to 22E each show an example of a usage mode of a semiconductor device of the present invention.

DETAILED DESCRIPTION OF THE INVENTION

Embodiment Mode

Figure 1:
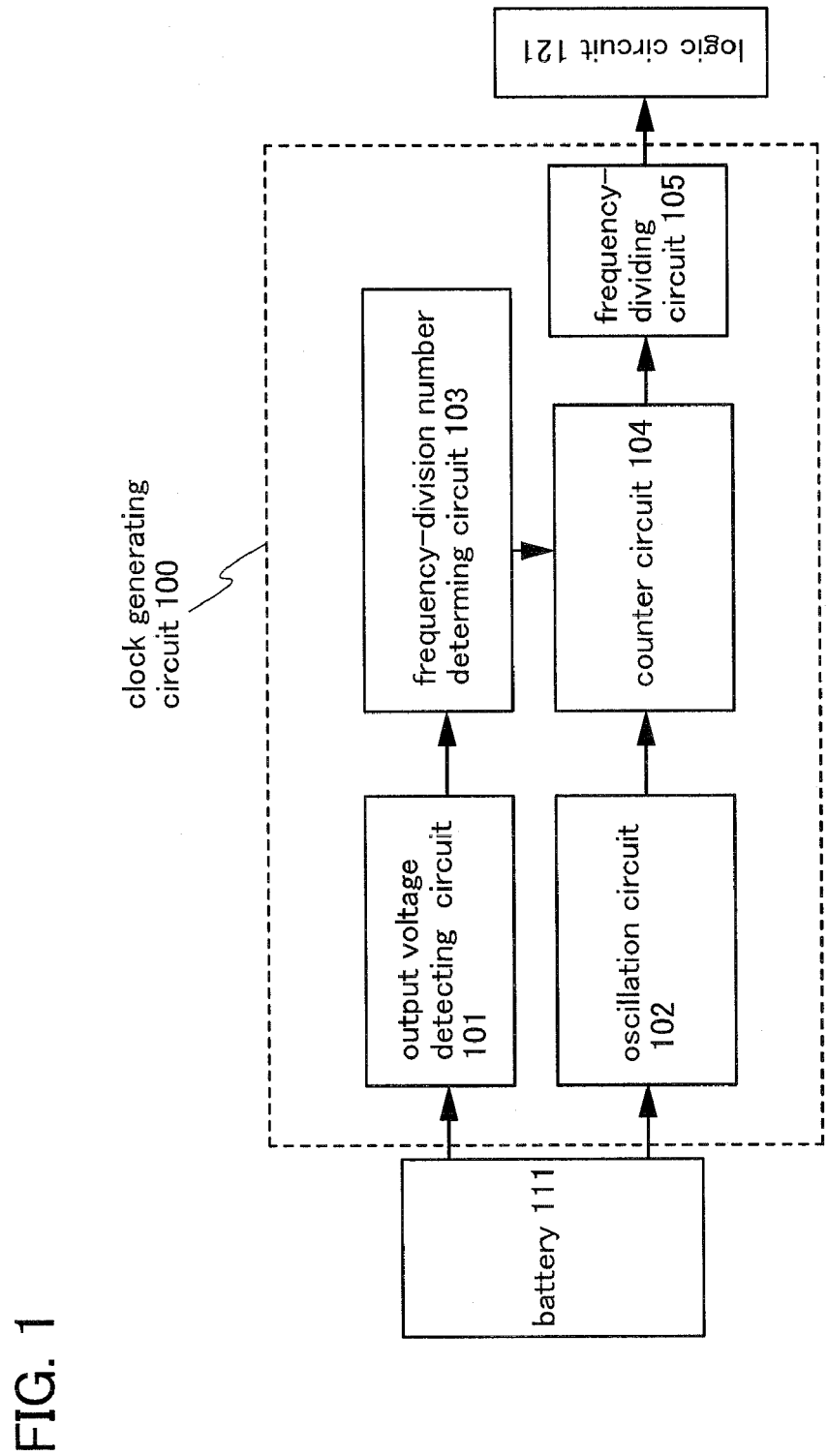
FIG. 1 describes a clock generating circuit of the present invention.

Embodiment modes and embodiments of the present invention will be explained below with reference to the drawings. However, it is to be easily understood by those skilled in the art that the present invention is not limited to the description below and the modes and details of the present invention can be changed in various ways without departing from the spirit and scope of the present invention. Therefore, the present invention should not be interpreted as being limited to the description of the embodiment modes and the embodiment below. Note that in the following description of the present invention, reference numerals denoting identical portions may be used in common in different drawings.

Embodiment Mode 1

In this embodiment mode, a clock generating circuit of the present invention is described with reference to drawings.

A clock generating circuit 100 of the present invention shown in FIG. 1 includes an output voltage detecting circuit 101 for detecting an output voltage from a battery 111; an oscillation circuit 102 that outputs a reference clock signal depending on the output voltage from the battery 111; a frequency-division number determining circuit 103 for determining the number of frequency-division by the output voltage detected by the output voltage detecting circuit 101; a counter circuit 104 that counts the number of waves of the reference clock signal that is output from the oscillation circuit; and a frequency-dividing circuit 105 that outputs a signal obtained by frequency-dividing the reference clock signal, as a clock signal, to a logic circuit 121 depending on the number of waves counted by the counter circuit 104 and the number of frequency-division.

The present invention has an effect of suppressing variation of the frequency of a clock signal even when an output voltage becomes lower along with degradation of the battery over time according to the discharging characteristic. This effect can be realized by frequency-dividing the reference clock signal that is input to the frequency-dividing circuit based on the number of frequency-division, and outputting, a signal obtained by frequency-dividing the reference clock signal based on the number of frequency-division that is based on the output voltage of the battery detected by the output voltage detecting circuit, and the number of waves of the reference clock signal output from the oscillation circuit and counted by the counter circuit. A specific structure and the like are described below.

Figure 2:
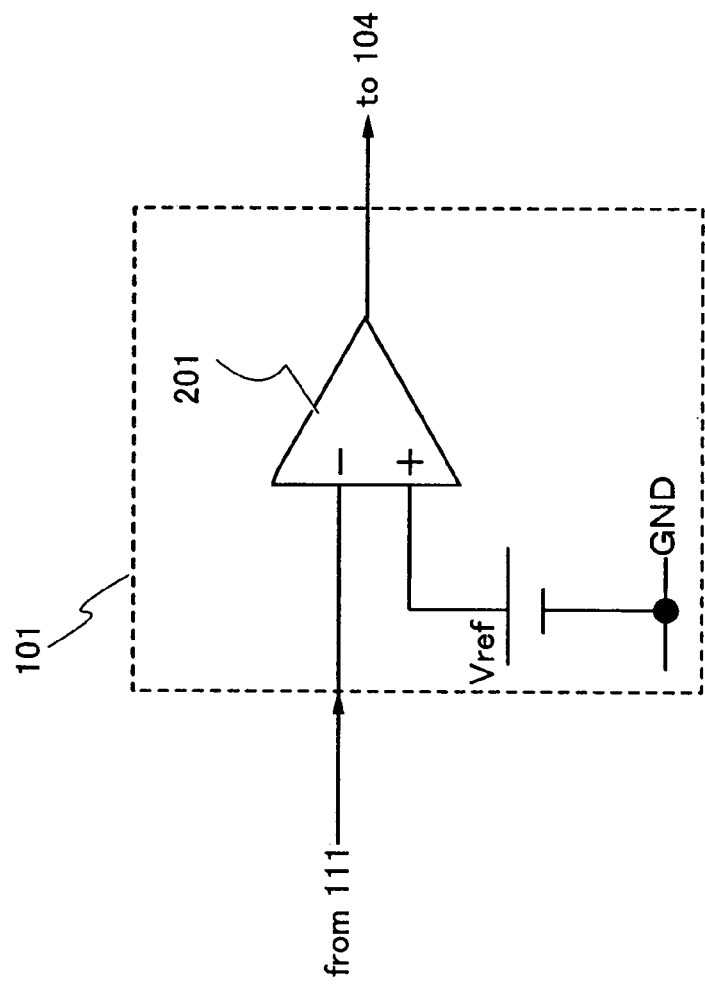
FIG. 2 describes a clock generating circuit of the present invention.

A specific structure of the output voltage detecting circuit 101 for detecting the output voltage from the battery 111, in the clock generating circuit 100 of the present invention shown in FIG. 1 is described in FIG. 2. As the output voltage detecting circuit 101 shown in FIG. 1, an inverting comparator can be used as shown in FIG. 2, for example. The output voltage from the battery 111 is input to an inverting input terminal of an inverting comparator 201, and a potential of $V_{ref}$ is input to a non-inverting input terminal of the comparator 201. When the output voltage from the battery 111 is lower than the potential of $V_{ref}$, an H-level (High-level) signal is output from an output from the inverting comparator 201. On the other hand, when the output voltage from the battery 111 is higher than the potential of $V_{ref}$, an L-level (Low-level) signal is output from an output from the comparator 201. If the output voltage from the battery 111 changes in a plurality of levels, a plurality of inverting comparators exemplified in FIG. 2 may be provided and a signal relating to the output voltage may be output from the logic circuit to the frequency-division number determining circuit 103. In this manner, detection of the output voltage from the battery 111 can be performed by the inverting comparator.

Note that in this embodiment mode, as an example, the output voltage from the battery 111 is described to go through three levels of $V_1$, $V_2$, and $V_3$, which satisfy a relationship of $V_1 > V_2 > V_3$. Accordingly, the output voltage detecting circuit 101 outputs information of whether the output voltage of the battery 111 is $V_1$, $V_2$, or $V_3$, to the frequency-division number determining circuit 103. Of course, the output voltage detected by the output voltage detecting circuit 101 of the present invention is not limited to $V_1$, $V_2$, and $V_3$. It is acceptable as long as the output voltage detecting circuit 101 detects the output voltage from the battery 111 and outputs a signal corresponding to the output voltage from the battery 111, to the frequency-division number determining circuit 103.

Figure 3A:
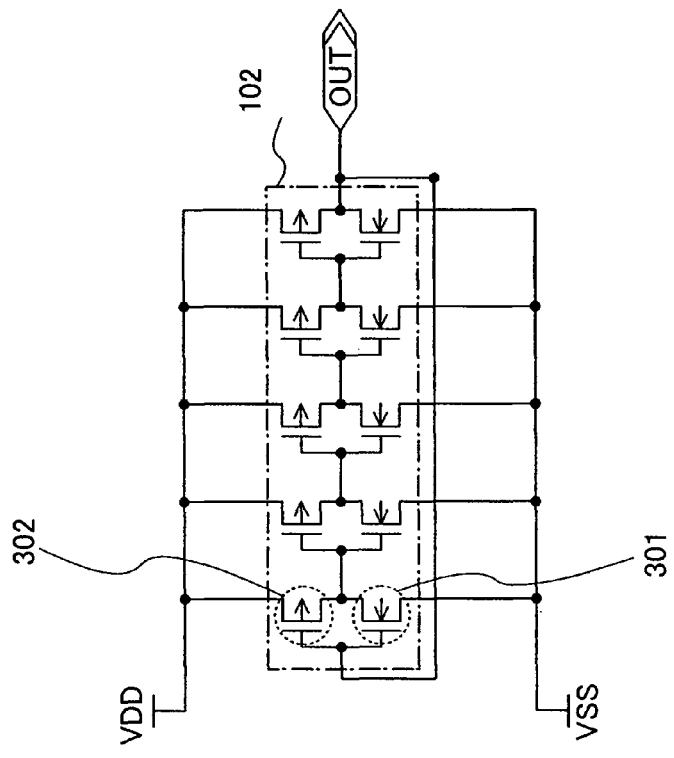
FIGS. 3A and 3B describe a clock generating circuit of the present invention.

A specific structure of the oscillation circuit 102, which outputs a reference clock signal according to the output voltage from the battery 111 in the clock generating circuit 100 of the present invention shown in FIG. 1, is described in FIG. 3A. An example of a structure of the oscillation circuit 102 shown in FIG. 1 is a structure shown in FIG. 3A, which includes a plurality of inverters, each inverter with a structure in which an N-channel transistor 301 and a P-channel transistor 302 are serially connected and gates of these two transistors are connected. The structure shown in FIG. 3A is that of a so-called ring oscillator. In FIG. 3A, the oscillation circuit 102 has a five stages structure; however, the structure is not limited thereto. Input terminals and output terminals of the plurality of inverters are connected, and the output of the last level is connected to the input terminal of the inverter of the first stage to form a loop structure. In order to oscillate a signal from the oscillation circuit 102, the number of inverters in this loop needs to be an odd number.

Note that in the present invention, the ring oscillator shown in FIG. 3A is not limited to an oscillation circuit, and the ring oscillator may be a crystal oscillator. That is, it is acceptable as long as the oscillation circuit in a structure of the present invention oscillates signals with different frequencies depending on the output voltage of the battery, which is input to the oscillation circuit. Note that by forming the transistors included in the ring oscillator with thin film transistors, the oscillation circuit 102 can be miniaturized.

In this specification, a signal output from the oscillation circuit 102 is called a reference clock signal. In addition, a signal that is output from the clock generating circuit 100 and drives the logic circuit or the like is called a clock signal.

Figure 3B:
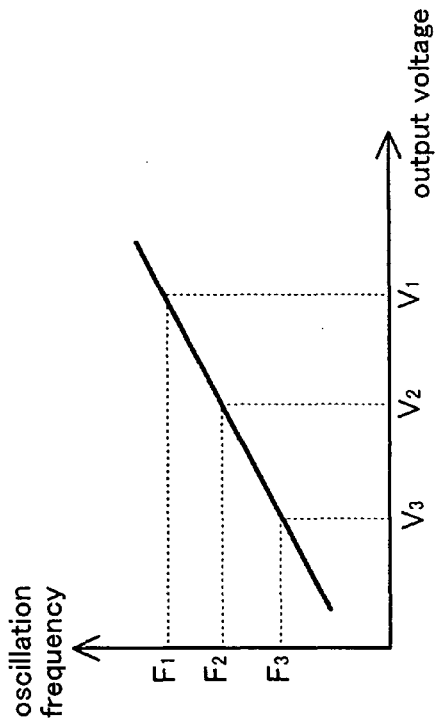

Characteristics of oscillation frequencies with respect to output voltages $V_1$, $V_2$, and $V_3$ from the battery 111, which are input to the oscillation circuit 102, are shown in FIG. 3B. The oscillation circuit 102 outputs a signal of a frequency $F_1$, $F_2$, or $F_3$ that corresponds to the output voltage $V_1$, $V_2$, or $V_3$ from the battery 111, respectively. Note that as shown in the figure, the frequencies in the oscillation circuit 102 satisfy a relationship of $F_1 > F_2 > F_3$. If the output voltage of the battery 111, which is input, is high, the oscillation circuit 102 outputs a signal with a high frequency, and if the output voltage of the battery 111, which is input, is low, the oscillation circuit 102 outputs a signal with a low frequency.

In addition, the frequency-division number determining circuit 103 in the clock generating circuit 100 of the present invention, shown in FIG. 1, is a circuit that determines the number of frequency-division based on a signal relating to the output voltage of the battery 111, which is output from the output voltage detecting circuit 101. The frequency-division number determining circuit 103 sets a counter value for resetting a counter in the counter circuit 104, by determining the number of frequency-division based on a signal relating to the output voltage of the battery 111 output from the output voltage detecting circuit 101, and outputting the number of frequency-division to the counter circuit 104.

The counter circuit 104 in the clock generating circuit 100 of the present invention, shown in FIG. 1, is a circuit that counts the number of waves of a reference clock signal that is output from the oscillation circuit 102. The counter circuit 104 counts the number of waves of the reference clock signal until the number of waves reaches the counter value for resetting the counter, which is determined by the frequency-division number determining circuit 103. The counter circuit 104 includes a combination of logic circuits such as flip-flop circuits, and counting is performed by inputting the reference clock signal from the oscillation circuit. The counter circuit 104 outputs a signal to the frequency-dividing circuit 105 when the number of waves reaches a counter value for resetting the counter, which is determined by the frequency-division number determining circuit 103. In addition, the counter circuit 104 resets the counter value of the counter circuit 104 along with outputting a signal to the frequency-dividing circuit 105.

In addition, the frequency-dividing circuit 105 in the clock generating circuit 100 of the present invention, shown in FIG. 1, is a circuit that frequency-divides a reference clock signal output from the oscillation circuit 102, based on a signal output to the frequency-dividing circuit 105 when the number of waves counted by the counter circuit 104 reaches a counter value that resets the counter. The frequency-dividing circuit 105 is a circuit that frequency-divides the reference clock signal that is output from the oscillation circuit 102 with the number of frequency-division of N (N is a natural number), if the counter value from the frequency-division number determining circuit 103 is N.

Note that, a battery in the present invention refers to a battery that changes in output voltage over time due to discharging or charging. Therefore, the battery 111 that is used in this embodiment mode corresponds to a primary battery or a secondary battery.

Subsequently, specific operation of the block diagram shown in FIG. 1 is described with reference to a timing chart and flow chart.

An example of an operation of the clock generating circuit 100 in the block diagram shown in FIG. 1 is described with reference to the flow chart in FIG. 4. An output voltage of the battery 111 in the example is in the range of $V_1$ or less and more than $V_2$, $V_2$ or less and more than $V_3$, or $V_3$ in the flow chart in FIG. 4. Also, a counter value of the counter circuit 104 is denoted as X. Further, when a signal output to the frequency-division number determining circuit 103 from the output voltage detecting circuit 101 is a signal shown when the output voltage of the battery 111 is in the range of $V_1$ or less and more than $V_2$, the frequency-division number determining circuit 103 resets the counter number of the counter circuit 104 when X=3 is satisfied. Similarly, when the signal output to the frequency-division number determining circuit 103 from the output voltage detecting circuit 101 is a signal shown when the output voltage of the battery 111 is $V_2$ or less and more than $V_3$, the frequency-division number determining circuit 103 resets the counter number of the counter circuit 104 when X=2 is satisfied. Furthermore, when the signal 111 output to the frequency number determining circuit 103 from the output voltage detecting circuit 101 is a signal shown when the output voltage of the battery 111 is $V_3$, the frequency-division determining circuit 103 resets the counter number of the counter circuit 104 when X=1 is satisfied.

Figure 4:
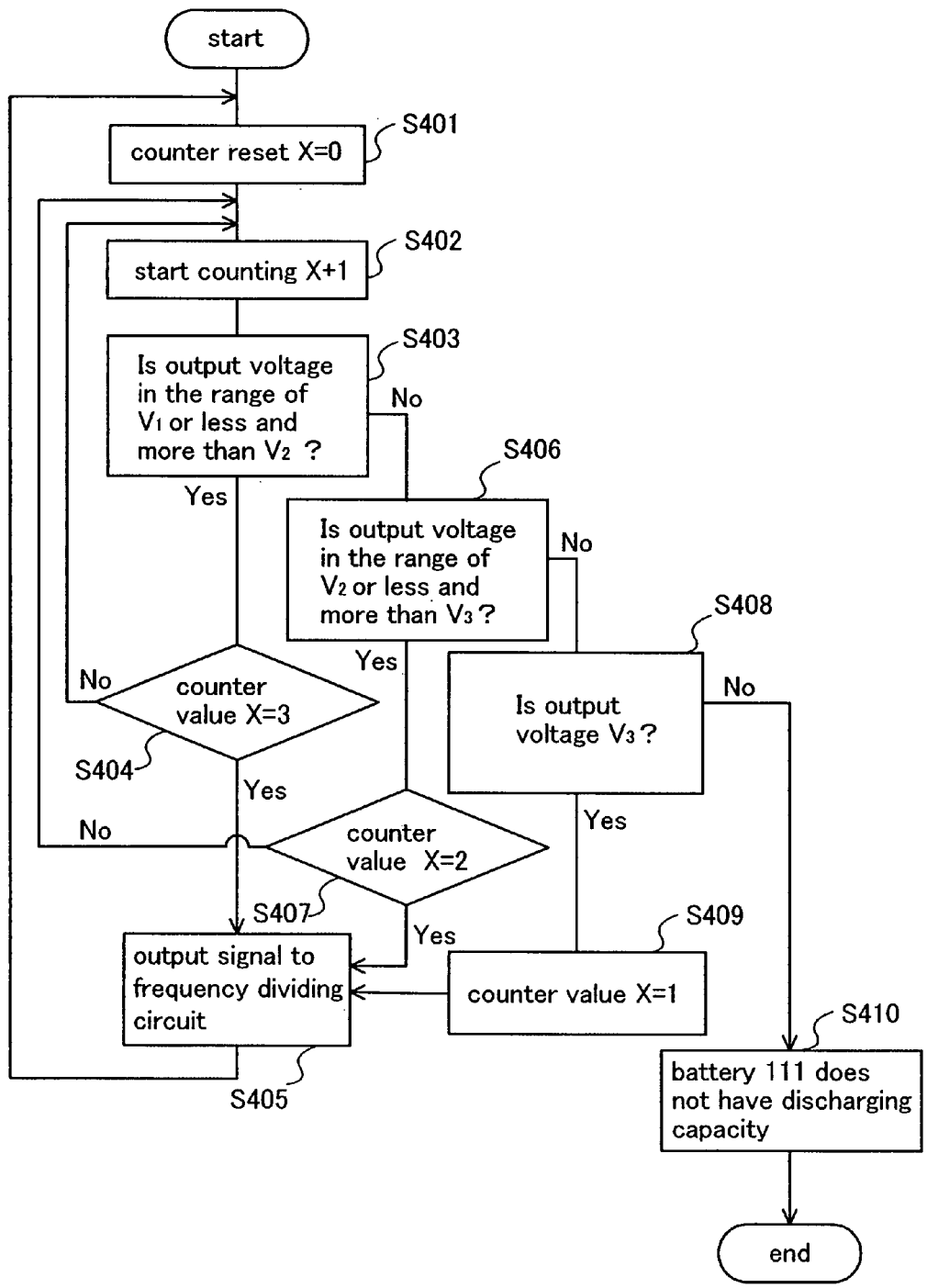
FIG. 4 describes a clock generating circuit of the present invention.

First, the counter circuit 104 resets the counter value before counting the number of waves of the reference clock signal that is output from the oscillation circuit 102 (Step S401 in FIG. 4). By resetting the counter value, the counter number X becomes 0 (X=0). The counter value is reset when it reaches a counter value that is determined based on the signal from the frequency-division number determining circuit 103 that is input to the counter circuit 104.

Then, the counter circuit 104 starts counting the reference clock signal from the oscillation circuit 102 (Step S402). Since the counter value means the number of waves of the reference clock signal after the resetting step, 1 is added to the counter value every 1 wavelength. In other words, in the counter circuit 104, the number of waves is counted by adding 1 to the counter value each time 1 wavelength worth of the reference clock signal is input.

In the counter circuit 104, with the start of the count, it is determined whether an output voltage from the battery 111, which determines the signal from the frequency-division number determining circuit 103 that is input to the counter circuit 104, is in the range of $V_1$ or less and more than $V_2$ detected by the output voltage detecting circuit 101 (Step S403). If the output voltage from the battery 111, which is detected by the output voltage detecting circuit 101 and determines the signal output from the frequency-division number determining circuit 103 that is input to the counter circuit 104, is in the range of $V_1$ or less and more than $V_2$, whether the counter value is 3 (X=3) is determined (Step S404). In Step S404, if the counter value is not X=3, the operation returns to Step S402 and addition to the counter value is performed. If the counter value is X=3 in Step S404, the signal is output to the frequency-dividing circuit 105 (Step S405), and the operation returns to Step S401 that resets the counter value of the counter circuit 104.

In Step S403, if the output voltage from the battery 111, which is detected by the output voltage detecting circuit 101 and determines the signal from the frequency-division number determining circuit 103 that is input to the counter circuit 104, is not in the range of $V_1$ or less and more than $V_2$, whether the output voltage of the battery 111 is in the range of $V_2$ or less and more than $V_3$ is determined (Step S406). If the output voltage from the battery 111, which is detected in the output voltage detecting circuit 101 and determines the signal from the frequency-division number determining circuit 103 that is input to the counter circuit 104, is in the range of $V_2$ or less and more than $V_3$, whether the counter value is 2 (X=2) is determined (Step S407). In Step S407, if the counter value is not X=2, Step S402 is repeated and addition to the counter value is performed. If the counter value is X=2 in Step S407, the operation moves on to Step S405, and returns to Step S401 that resets the counter value of the counter circuit.

In Step S406, if the output voltage from the battery 111, which is detected by the output voltage detecting circuit 101 and determines the signal from the frequency-division number determining circuit 103 that is input to the counter circuit

104, is not in the range of $V_2$ or less and more than $V_3$, whether the output voltage of the battery 111 is $V_3$ is determined (Step S408). If the output voltage from the battery 111, which is detected by the output voltage detecting circuit 101 and determines the signal from the frequency-division number determining circuit 103 that is input to the counter circuit 104, is $V_3$, when the counter value becomes 1 (X=1) (Step S409), the operation moves on to the Step S405, and returns to Step S401 that resets the counter value of the counter circuit 104.

In Step S408, if the output voltage from the battery 111, which is detected by the output voltage detecting circuit 101 and determines the signal from the frequency-division number determining circuit 103 that is input to the counter circuit 104, is not $V_3$, the clock generating circuit 100 stops the clock signal because the battery 111 does not have enough remaining power for generating a clock signal (Step S410).

Subsequently, timing charts of the operation relating to the structure in FIG. 1, which is described with reference to the flow chart in FIG. 4 mentioned above, is described with reference to FIG. 5.

Figure 5:
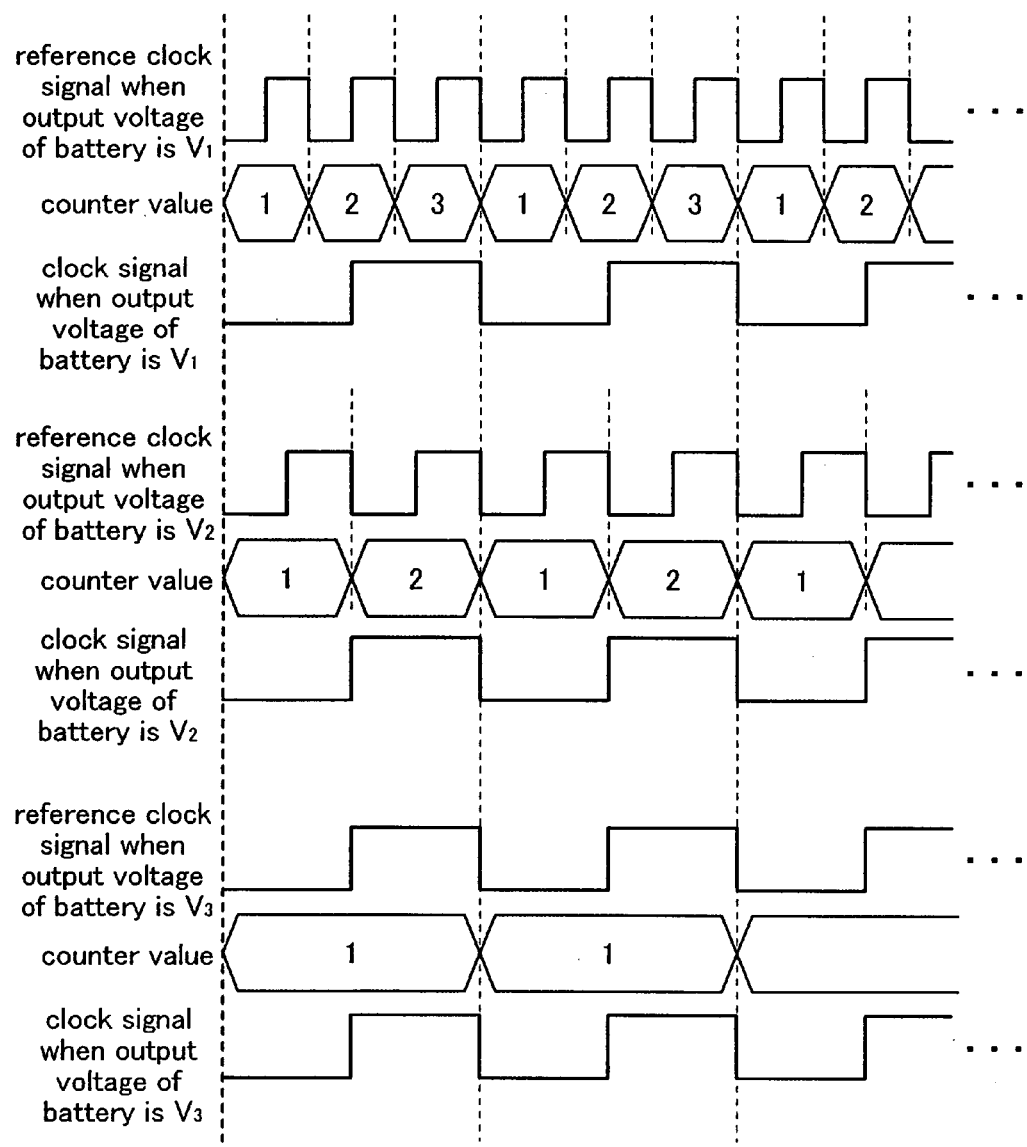
FIG. 5 describes a clock generating circuit of the present invention.

FIG. 5 shows timing charts of the reference clock signal that is output from the oscillation circuit 102, the counter value in the counter circuit 104, and the clock signal that is output from the clock generating circuit 100, when the output voltage from the battery 111 is each of $V_1$, $V_2$, and $V_3$.

The output voltage of the battery 111 changes from $V_1$, $V_2$, to $V_3$ over time. Accordingly, as shown in FIG. 3B, frequency of the reference clock signal decreases depending on the change from $V_1$, $V_2$, to $V_3$. Therefore, frequency of the reference clock signal shown in FIG. 5 also decreases depending on the change from $V_1$, $V_2$, to $V_3$. Also, FIG. 5 shows that the counter value is reset at X=3 when the output voltage is $V_1$, X=2 when the output voltage is $V_2$, and X=1 when the output voltage is $V_3$, as described above.

The timing charts shown in FIG. 5 are described along with the flow chart described in FIG. 4. The counter value is reset in Step S401 of FIG. 4. In Step S402 after Step S401, each counter value when the output voltage of the battery 111 is $V_1$, $V_2$, and $V_3$ increases by 1, depending on the number of waves of the reference clock signal when the output voltage of the battery is $V_1$, $V_2$, and $V_3$, respectively. In the case that the output voltage of the battery is $V_1$ (Step S403 in FIG. 4), when the counter value of the counter circuit 104 is 3 (Step S404 in FIG. 4), the counter circuit 104 outputs to the frequency-dividing circuit 105 a signal for performing a frequency-division (Step S405 in FIG. 4). The frequency-dividing circuit 105 performs frequency-division of the reference clock signal based on the signal for performing a frequency-division that is output from the counter circuit 104.

Similarly, in the case that the output voltage from the battery 111 is $V_2$ (Step S406 in FIG. 4), when the counter value of the counter circuit 104 is 2 (Step S407 in FIG. 4), the counter circuit 104 outputs a signal to the frequency-dividing circuit 105 (Step S405 in FIG. 4). The frequency-dividing circuit 105 performs frequency-division of the reference clock signal based on the signal that is output from the counter circuit 104.

Further, in the case that the output voltage from the battery 111 is $V_3$ (Step S408 in FIG. 4), when the counter value of the counter circuit 104 is 1 (Step S409 in FIG. 4), the counter circuit 104 outputs a signal to the frequency-dividing circuit 105. The frequency-dividing circuit 105 performs frequency-division of the reference clock signal based on the signal that is output from the counter circuit 104.

In this embodiment mode, the frequency-dividing circuit 105 is described as that which frequency-divides a reference clock signal by the number of frequency-division of three, when a signal is output from the counter circuit 104 in the case that the output voltage from the battery 111 is $V_1$. In addition, in this embodiment mode, the frequency-dividing circuit 105 is described as that which frequency-divides the reference clock signal by the number of frequency-division of two, when a counter value is output from the counter circuit 104 in the case that the output voltage from the battery 111 is $V_2$. Further, in this embodiment mode, the frequency-dividing circuit 105 is described as that which frequency-divides the reference clock signal by the number of frequency-division of one, when a counter value is output from the counter circuit 104 in the case that the output voltage from the battery 111 is $V_3$.

In the present invention, by counting the number of waves of a reference clock signal counted by the counter circuit and outputting a signal for performing a frequency-division according to an output voltage from the battery, frequency-division according to the counter value can be performed in the frequency-dividing circuit. Therefore, in the clock generating circuit, as shown in FIG. 5, frequency of the clock signal to be output can be output without drastically changing depending on output voltages $V_1$, $V_2$, and $V_3$ of the battery. Accordingly, remaining power of the battery can be utilized effectively without causing degradation in quality of an electronic appliance due to variation in a clock signal.

Conventionally, variation in frequency of a clock signal from the clock generating circuit was reduced by providing a constant-voltage circuit such as a regulator circuit between a battery and an oscillation circuit. In the present invention, it is possible to output a clock signal with little fluctuation of a frequency without providing a constant-voltage circuit. Accordingly, in the present invention, an electronic appliance can be miniaturized compared to that provided with a constant-voltage circuit, which is particularly useful in an electronic appliance or the like with a limited design area of a circuit.

Note that in the present invention, the number of frequency-division that corresponds to a counter value is not restricted, and the number of frequency-division may be determined appropriately based on frequency of a clock signal.

In the above manner, the present invention can provide a clock generating circuit that can suppress variation of oscillation frequency from the clock generating circuit, which is due to a change in the output voltage according to a discharging characteristic of the battery, and effectively utilize the remaining power of the battery. Accordingly, lifetime of the battery can be lengthened without causing degradation in quality of an electronic appliance due to variation in a clock signal.

In addition, the clock generating circuit of the present invention can generate a clock signal with little variation of frequency, without providing a constant-voltage circuit such as a regulator circuit in an input portion of the clock generating circuit. Accordingly, for an electronic appliance or the like equipped with the clock generating circuit of the present invention, power consumption can be reduced and miniaturization of the electronic appliance can be achieved.

Note that this embodiment mode can be implemented in combination with technical elements of other embodiment modes in this specification.

Embodiment Mode 2

In this embodiment mode, a semiconductor device capable of transmitting and receiving information wirelessly, which includes the clock generating circuit described in the above embodiment mode, is described with reference to drawings.

In recent years, a semiconductor device such as an RF tag that combines an ultra-compact IC chip and an antenna for wireless communication has received attention. An RF tag can write and read data by exchanging a communication signal (operational magnetic field) using a wireless communication device (also called a reader/writer).

As an application field of a semiconductor device, such as an RF tag, capable of transmitting and receiving information wirelessly, commodity management in the distribution industry can be given as an example. Although at present, commodity management utilizing barcodes or the like is the mainstream, a barcode is read optically, and data cannot be read if there is a blocking object. On the other hand, since data of an RF tag is read wirelessly, data can be read even if there is a blocking object. Accordingly, improvement in efficiency of commodity management and reduction in cost can be realized. In addition, an RF tag can be applied to a wide range of fields, and can be applied to railway tickets, airplane tickets, and automatic reset of fees, for example.

Figure 6:
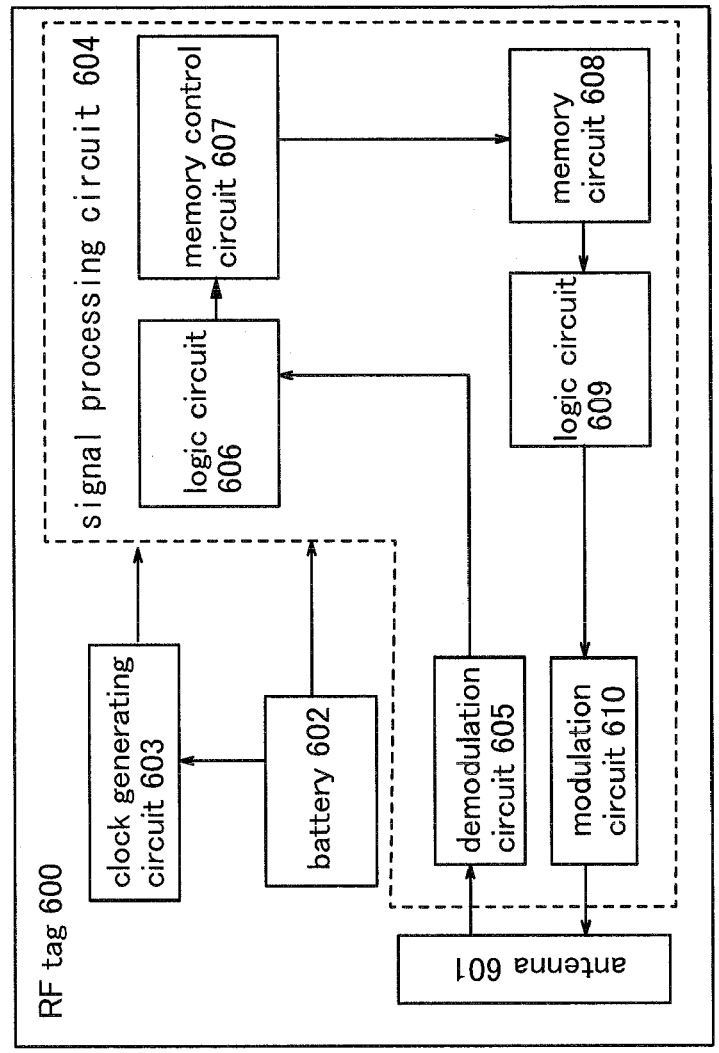
FIG. 6 describes a clock generating circuit of the present invention.

In this embodiment mode, an example of a semiconductor device in the present invention is described with reference to FIG. 6. FIG. 6 is a block diagram of an RF tag.

In an RF tag 600 in FIG. 6, a communication signal that is received by an antenna 601 is input to a demodulation circuit 605 in a signal processing circuit 604. Normally, a communication signal obtained by processing carrier of 13.56 MHz, 915 MHz, or the like by ASK (amplitude shift keying) modulation, FSK (frequency shift keying) modulation, or the like is transmitted. In FIG. 6, a reference clock signal is necessary for the signal processing circuit 604 to process a signal. For the clock signal, a clock signal that is obtained from an output voltage of a battery 602 input to the clock generating circuit 603 and output from the clock generating circuit 603 is used. In addition, in FIG. 6, power for driving the signal processing circuit 604 is supplied by the battery 602. The communication signal that is subjected to ASK modulation or PSK modulation is demodulated in the demodulation circuit 605. The signal after demodulation is transmitted to a logic circuit 606 and analyzed. The signal analyzed in the logic circuit 606 is transmitted to a memory control circuit 607, and based on this signal, a memory control circuit 607 controls a memory circuit 608, and data stored in the memory circuit 608 is taken out and transmitted to a logic circuit 609. After an encoding process in the logic circuit 609, a modulation circuit 610 modulates the carrier.

Subsequently, a pattern diagram of the RF tag 600 shown in FIG. 6 is described with reference to FIGS. 7A and 7B. Note that portions in FIGS. 7A and 7B that correspond to FIG. 6 are denoted by the same reference numerals, and descriptions thereof are omitted. Note also that the clock generating circuit described in FIG. 6 is described below as that which is formed over the same substrate as the signal processing circuit in FIGS. 7A and 7B.

Figure 7A:
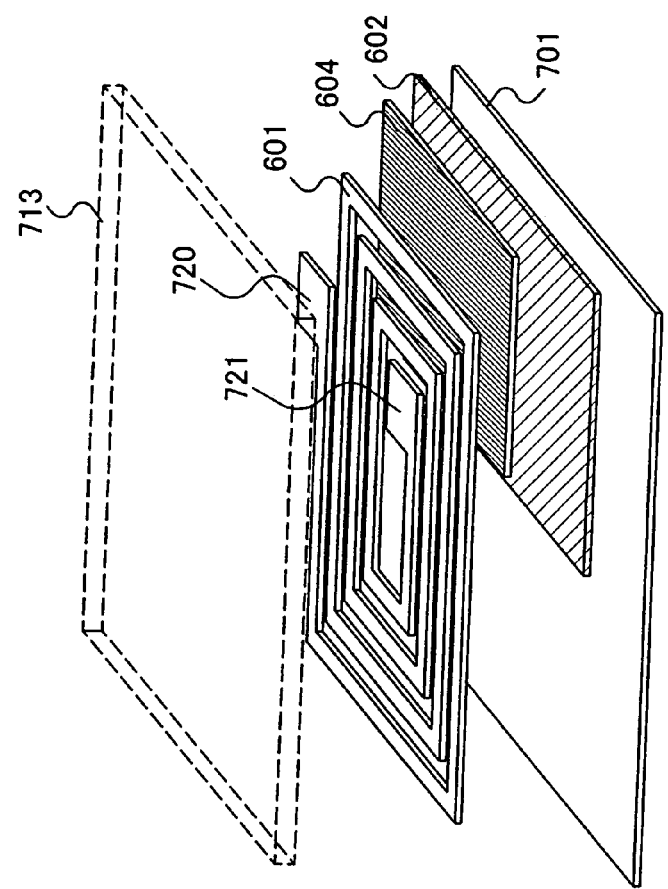
FIGS. 7A and 7B describe a clock generating circuit of the present invention.
Figure 7B:
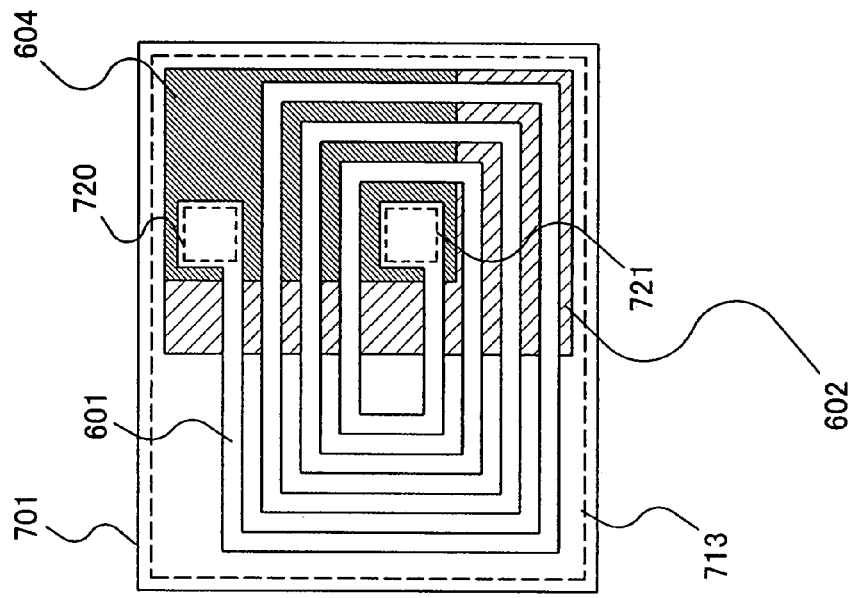

The RF tag 600 shown in FIG. 7A has the antenna 601, the battery 602, the clock generating circuit 603, and the signal processing circuit 604 over a substrate 701. The antenna 601 includes a connection terminal 720 and a connection terminal 721. The connection terminal 720 and the connection terminal 721 of the antenna 601 are each connected to the signal processing circuit 604.

For a transistor included in the signal processing circuit 604, transistors of a variety of modes can be applied. Accordingly, there is no restriction on the type of transistor that can be applied. Therefore, a thin film transistor (TFT) using a non-single-crystal semiconductor film typified by amorphous silicon or polycrystalline silicon; a transistor formed using a semiconductor substrate or an SOI substrate; a MOS transistor; a junction type transistor; a bipolar transistor; a transistor using a compound semiconductor of ZnO, a-InGaZnO, or the like; a transistor using an organic semiconductor or carbon nanotube; or the like can be applied. Note that the non-single-crystal semiconductor film may contain hydrogen or halogen.

A substrate of a variety of kinds can be used for the substrate 701, without restriction to a specific kind. For example, a single-crystal substrate, an SOI substrate, a glass substrate, a quartz substrate, a plastic substrate, or the like can be used. Alternatively, the signal processing circuit 604 may be formed over a certain substrate, and then the signal processing circuit 604 may be moved to another substrate and placed over the other substrate.

Figure 8A:
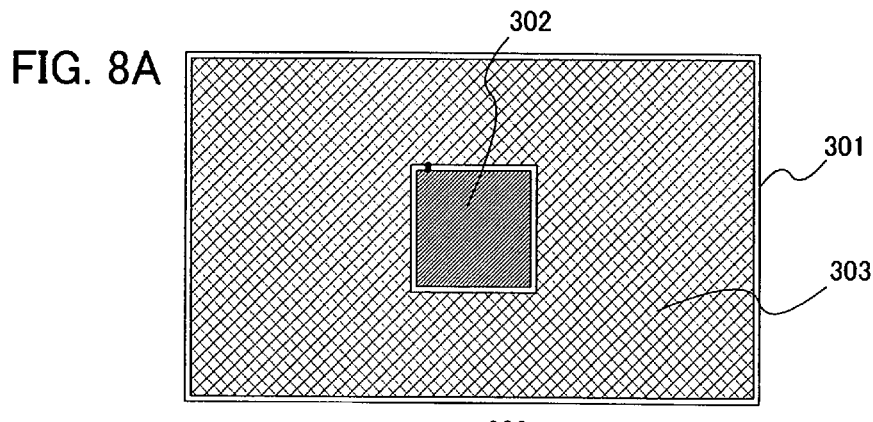
FIGS. 8A to 8E each describe a clock generating circuit of the present invention.
Figure 8B:
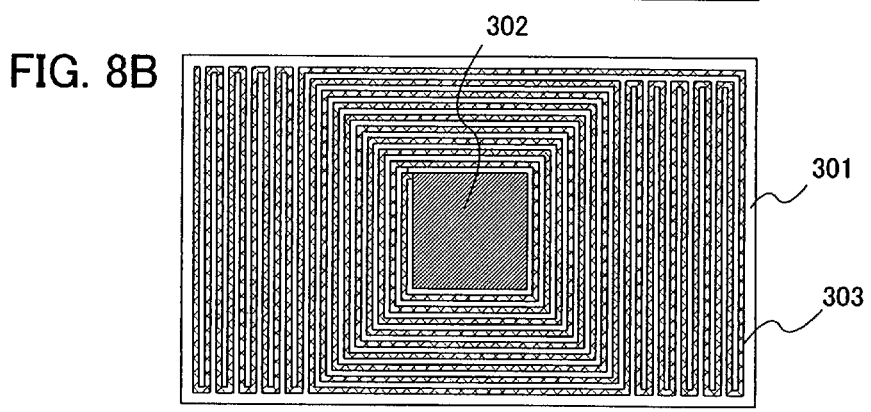
Figure 8C:
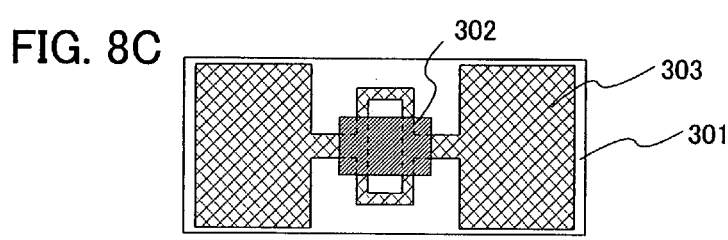
Figure 8D:
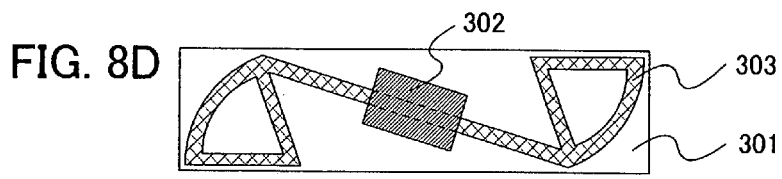
Figure 8E:
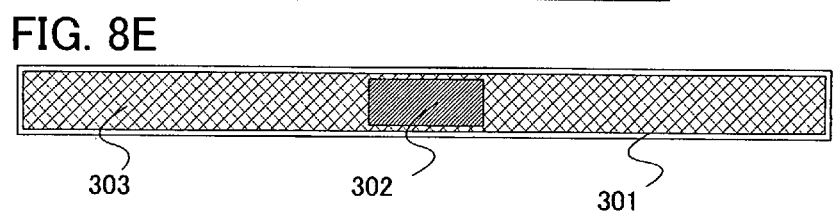

A form of the antenna 601 is not particularly limited. For example, as shown in FIG. 8A, a sheet of an antenna 803 may be placed so as to surround a signal processing circuit 802 over a substrate 801. Also, as shown in FIG. 8B, a narrow antenna 803 may be placed around the signal processing circuit 802 over the substrate 801. Further, as shown in FIG. 8C, the antenna 601 may take a form for receiving an electromagnetic wave of a high frequency. Furthermore, as shown in FIG. 8D, the antenna 601 may take a form that is 180 degrees omnidirectional. Alternatively, as shown in FIG. 8E, the antenna 601 may take a form that is elongated like a stick. In addition, the antenna 601 may take a form of a so-called dipole antenna, a loop antenna, a Yagi antenna, a patch antenna, a minute antenna, or the like.

Note that in FIGS. 8A to 8E, although there is no component illustrated that corresponds to a battery for the sake of simplifying the description, a battery is provided for a semiconductor device of the present invention equipped with a clock generating circuit.

The antenna 601 shown in FIG. 7A may be formed over the same substrate as that over which the signal processing circuit 604 is formed, or may be formed over a different substrate from that over which the signal processing circuit 604 is formed. A substrate of a variety of kinds can be used for the substrate over which the antenna 601 is formed, without restriction to a specific kind. For example, the antenna 601 can be formed over a single-crystal substrate, an SOI substrate, a glass substrate, a quartz substrate, a plastic substrate, or the like. If the antenna 601 is formed over the same substrate as the signal processing circuit 604, the antenna 601 may be formed by forming a conductive film by a sputtering method, a CVD method, a spin coating method, or the like, and then patterning the conductive film. Alternatively, the antenna 601 may be formed by a droplet discharging method typified by an inkjet method, by a screen printing method, or the like. The antenna 601 can also be formed by the foregoing method in the case where the antenna 601 is formed over a different substrate from that over which the signal processing circuit 604 is formed; however, the antenna 601 is preferably formed by a screen printing method.

Note that the substrate over which the signal processing circuit 604 is formed and the antenna 601 can be connected by a known method. For example, the antenna and the signal processing circuit may be connected by wire bonding connection or bump connection. Alternatively, a method of making a surface of the substrate, over which the signal processing circuit made into a chip is formed, into an electrode and attaching it to the antenna may be used. In this method, the attachment can be performed using an ACF (anisotropic conductive film).

The appropriate length of the antenna differs depending on the frequency used for reception. In general, the length may be 1/n (n is an integer) of a wavelength, for example, about 60 mm (½ wavelength) or about 30 mm (¼ wavelength) when the frequency is 2.45 GHz.

In FIG. 7A, although the antenna 601 is stacked over the same substrate as the signal processing circuit 604, the antenna 601 may be provided as an external antenna. Note that when the antenna 601 is stacked over the same substrate 701 as the signal processing circuit 604 as shown in FIG. 7A, it is preferable that the antenna is a minute loop antenna, a minute dipole antenna, or the like.

A battery can be applied to the battery 602 as long as it is a primary battery or a secondary battery. Also, a semiconductor device can be applied to the clock generating circuit of the present invention as long as it is equipped with a battery of which an output voltage changes by a change in discharging characteristic over time.

Note that the structure of the semiconductor device equipped with the clock generating circuit of the present invention is not limited to the structure shown in FIG. 7A. For example, FIG. 7B shows a structure of placing the signal processing circuit 604 between the antenna 601 and the battery 602. Alternatively, the battery 602 may be placed between the antenna 601 and the signal processing circuit 604, or the antenna 601 may be placed between the battery 602 and the signal processing circuit 604. In addition, the area ratio of the antenna 601, the battery 602, and the signal processing circuit 604 is not limited thereto. That is, when the semiconductor device equipped with the clock generating circuit of the present invention is observed on a layer-by-layer basis, the positional relationship of the antenna 601, the battery 602, and the signal processing circuit 604 is not limited. The antenna 601 and the signal processing circuit 604 may be formed on different substrates, or the antenna 601, the signal processing circuit 604, and the battery 602 may be formed over the same substrate.

Note that this embodiment mode can be implemented in combination with technical elements of other embodiment modes in this specification. That is, this embodiment mode can provide a semiconductor device equipped with a clock generating circuit that can suppress variation of an oscillation frequency of a clock signal outputted from the clock generating circuit, which is due to a change in the output voltage according to a discharging characteristic of the battery, and effectively utilize the remaining power of the battery. Accordingly, lifetime of the battery can be lengthened without causing degradation in quality of an electronic appliance due to variation in a clock signal.

In addition, the semiconductor device equipped with the clock generating circuit of the present invention can generate a clock signal with little variation of its frequency, without providing a constant-voltage circuit such as a regulator circuit in an input portion of the clock generating circuit. Accordingly, for the semiconductor device equipped with the clock generating circuit of the present invention, reduction in power consumption and miniaturization of the semiconductor device can be achieved.

Embodiment Mode 3

In this embodiment mode, an example of the semiconductor device described in the foregoing embodiment mode that is provided with a battery that can be charged by an electromagnetic wave is described with reference to drawings.

Figure 9:
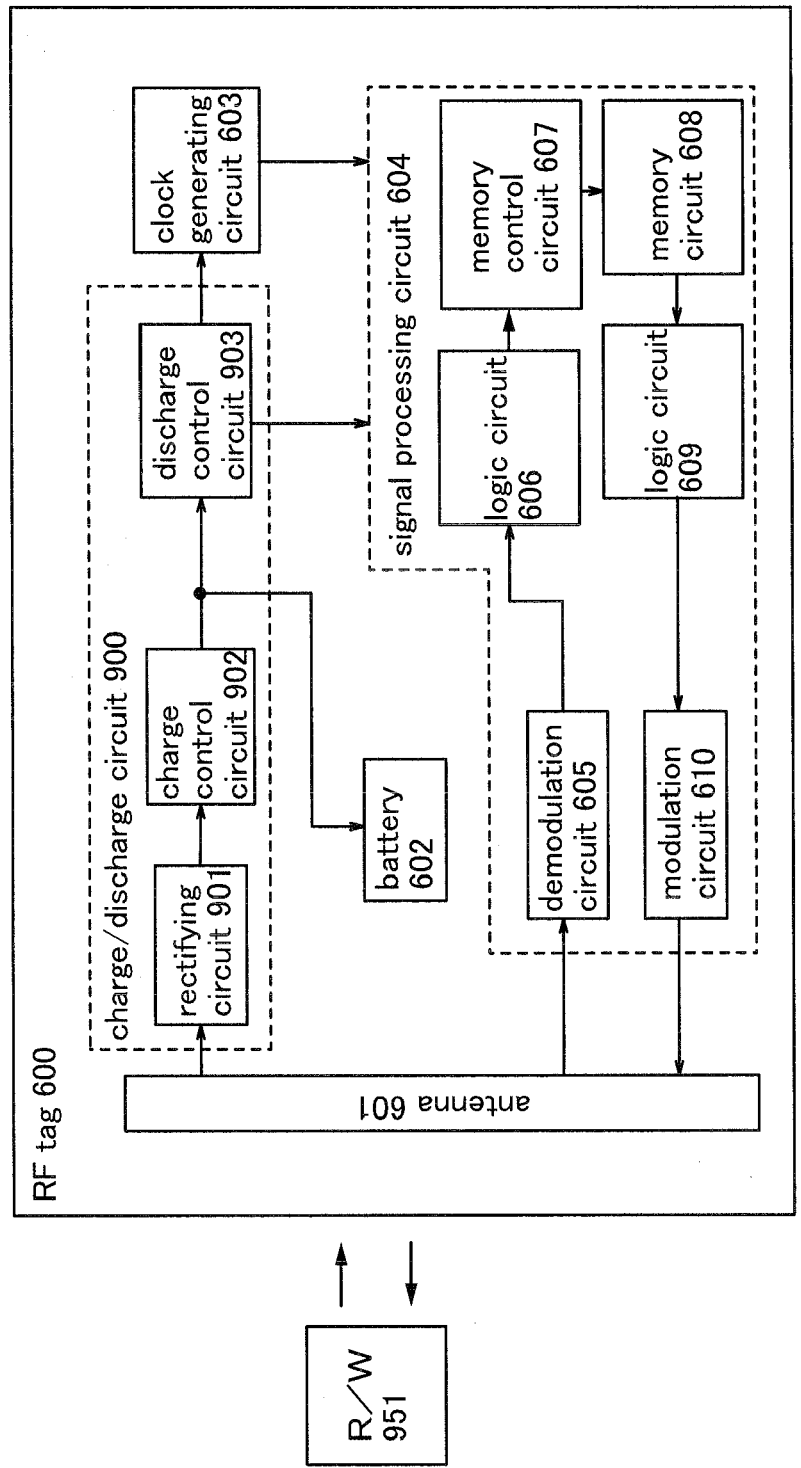
FIG. 9 describes a clock generating circuit of the present invention.

The semiconductor device of this embodiment mode is described using the RF tag shown in FIG. 9 as an example.

The RF tag 600 shown in FIG. 9 includes the antenna 601, the battery 602, the clock generating circuit 603, the signal processing circuit 604, and a charge/discharge circuit 900.

The charge/discharge circuit 900 includes a rectifying circuit 901, a charge control circuit 902, and a discharge control circuit 903. Also, the signal processing circuit 604 includes the demodulation circuit 605, the logic circuit 606, the memory control circuit 607, the memory circuit 608, the logic circuit 609, and the modulation circuit 610. Note that what is different from the structure in FIG. 6 of foregoing Embodiment Mode 2 is that the charge/discharge circuit 900 is provided.

Concerning the signal processing circuit 604, a communication signal transmitted from a reader/writer 951 and received by the antenna 601 is input to the demodulation circuit 605 in the signal processing circuit 604. Normally, a communication signal obtained by processing a carrier of 13.56 MHz, 915 MHz, or the like by ASK modulation, PSK modulation, or the like is transmitted. In a case where the communication signal is a 13.56 MHz signal, for example, it is desirable that the frequency of an electromagnetic wave for charging the battery 602 which is transmitted from the reader/writer is the same. Further, when a signal for charging and a signal for communication are in the same frequency band, the antenna 601 can be shared. When the antenna 601 is shared, miniaturization of the semiconductor device can be achieved.

In FIG. 9, a reference clock signal is necessary for the signal processing circuit 604 to process a signal. For the clock signal, a clock signal is used that is output from the clock generating circuit 603, which is generated from an output voltage of a battery 602 input to the clock generating circuit 603 through the discharge control circuit 903. In addition, in FIG. 9, power for driving the signal processing circuit 604 is supplied by the battery 602 through the discharge control circuit 903. The communication signal that has been subjected to ASK modulation or PSK modulation is demodulated in the demodulation circuit 605. The signal after demodulation is transmitted to a logic circuit 606 and analyzed. The signal analyzed in the logic circuit 606 is transmitted to a memory control circuit 607, and based on this signal, the memory control circuit 607 controls a memory circuit 608, and data stored in the memory circuit 608 is taken out and transmitted to a logic circuit 609. After an encoding process in the logic circuit 609, a modulation circuit 610 modulates the carrier.

An example of an operation in FIG. 9 is described in a case where the antenna 601 receives an electromagnetic wave from the reader/writer 951 for charging the battery 602. Note that in this embodiment mode, an example of providing a first switch and a second switch for the charge control circuit 902 and the discharge control circuit 903, respectively, is described.

First, when an electromagnetic wave is transmitted from the reader/writer 951, the antenna 601 starts reception of the electromagnetic wave transmitted from the reader/writer 951. Then, the second switch provided in the discharge control circuit 903 is turned off so that electrical power of the battery 602 is not supplied to another circuit.

Subsequently, the first switch provided for the charge control circuit 902 is turned on, and charging of the battery 602 starts by a signal that is rectified and smoothed through the rectifying circuit 901. Then, when voltage of the battery 602 reaches or goes over a predetermined voltage, the first switch provided for the charge control circuit 902 is turned off, and the charging is stopped.

Next, the second switch is turned on at the same time as or after the first switch is turned off, and electrical power is supplied to the signal processing circuit 604 and the clock generating circuit 603 through the discharge control circuit 903. Then, the RF tag 600 transmits an electromagnetic wave that contains a signal for starting communication (hereinafter also simply referred to as a "signal") to the reader/writer 951.

Note that in the structure shown in FIG. 9, a case where the charge/discharge circuit 900 and the signal processing circuit 604 share the antenna 601 is shown; however, a structure in which the charge/discharge circuit 900 and the signal processing circuit 604 each have an antenna may be employed. For example, a structure in which the charge/discharge circuit 900 and the signal processing circuit 604 are provided with a first antenna circuit and a second antenna circuit, respectively, may be employed. Note that, by providing the first antenna circuit for the charge/discharge circuit 900 and the second antenna circuit for the signal processing circuit 604, the first antenna circuit can be made to receive an electromagnetic wave that randomly occurs outside, and the second antenna circuit can be made to receive an electromagnetic wave that has a specific wavelength that is oscillated from the reader/writer 951.

As described above, by providing a battery capable of wireless charging, a battery provided in a semiconductor device can easily be charged. Further, when electromagnetic waves are received over a certain period of time and the battery is charged, and the stored electrical power is discharged in pulses, a large amount of electrical power can be supplied from the battery to a load portion even when the electromagnetic wave used for charging the battery is weak.

Note that this embodiment mode can be implemented in combination with technical elements of other embodiment modes in this specification. That is, this embodiment mode can provide a semiconductor device equipped with a clock generating circuit that can suppress variation of an oscillation frequency from the clock generating circuit, which is due to a change in the output voltage according to a discharging characteristic of the battery, and effectively utilize the remaining power of the battery. Accordingly, the lifetime of the battery can be lengthened without causing degradation in quality of an electronic appliance due to variation in a clock signal.

In addition, the semiconductor device equipped with the clock generating circuit of the present invention can generate a clock signal with little variation, without providing a constant-voltage circuit such as a regulator circuit in an input portion of the clock generating circuit. Accordingly, for the semiconductor device equipped with the clock generating circuit of the present invention, reduction in power consumption and miniaturization of the semiconductor device can be achieved.

Embodiment 1

In this embodiment, an example of a manufacturing method of the semiconductor device described in the foregoing embodiment mode will be described with reference to drawings. In this embodiment, a structure in which an antenna, a battery, and a signal processing circuit in a semiconductor device are provided over the same substrate, using a thin film transistor, will be described. Note that it is desirable to form the antenna, the battery, and the signal processing circuit over the substrate at one time because miniaturization can be achieved. In addition, an example in which a thin film secondary battery is used for the battery is described.

First, a separation layer 1303 is formed over a surface of a substrate 1301 with an insulating film 1302 therebetween. Next, an insulating film 1304 which serves as a base film and a semiconductor film 1305 (e.g., a film which includes amorphous silicon) are stacked (see FIG. 10A). Note that the insulating film 1302, the separation layer 1303, the insulating film 1304, and the semiconductor film 1305 can be formed in succession.

The substrate 1301 may be a glass substrate, a quartz substrate, a metal substrate (e.g. a ceramic substrate, a stainless steel substrate, or the like), or a semiconductor substrate such as a Si substrate, or the like. Alternatively, a plastic substrate formed of polyethylene terephthalate (PET), polyethylene naphthalate (PEN), polyether sulfone (PES), acrylic, or the like can be used. Note that in this step, the separation layer 1303 is provided over an entire surface of the substrate 1301 with the insulating film 1302 interposed therebetween; however, if necessary, the separation layer may be selectively provided by using a photolithography method after providing the separation layer over an entire surface of the substrate 1301.

The insulating film 1302 and the insulating film 1304 are formed using an insulating material such as silicon oxide, silicon nitride, silicon oxynitride (SiOxNy, where x>y>0), or silicon nitride oxide (SiNxOy, where x>y>0), by a CVD method, a sputtering method, or the like. For example, when the insulating film 1302 and the insulating film 1304 have a two-layer structure, preferably a silicon nitride oxide film is formed as a first insulating film and a silicon oxynitride film is formed as a second insulating film. Alternatively, a silicon nitride film may be formed as a first insulating film and a silicon oxide film may be formed as a second insulating film. The insulating film 1302 serves as a blocking layer which prevents an impurity element from the substrate 1301 from being mixed into the separation layer 1303 or an element formed thereover. The insulating film 1304 serves as a blocking layer which prevents an impurity element from the substrate 1301 or the separation layer 1303 from being mixed into an element formed thereover. By forming the insulating films 1302 and 1304 which serve as blocking layers in this manner, an element formed thereover can be prevented from being adversely affected by an alkali metal such as Na or an alkali earth metal from the substrate 1301, or an impurity element included in the separation layer 1303. Note that when quartz is used as the substrate 1301, the insulating films 1302 and 1304 may be omitted from the structure.

As the separation layer 1303, a metal film, a stacked-layer structure including a metal film and a metal oxide film, or the like can be used. As the metal film, a single-layer structure or a stacked-layer structure is formed using a film formed of any of the elements tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or of an alloy material or a compound material containing such an element as a main component. These materials can be formed by using a sputtering method, various CVD methods, such as a plasma CVD method, or the like. As the stacked-layer structure including a metal film and a metal oxide film, after the aforementioned metal film is formed, plasma treatment in an oxygen atmosphere or an $N_2O$ atmosphere, or heat treatment in an oxygen atmosphere or an $N_2O$ atmosphere is performed, so that an oxide or an oxynitride of the metal film can be formed on a surface of the metal film. For example, when a tungsten film is formed as the metal film by a sputtering method, a CVD method, or the like, plasma treatment is performed on the tungsten film so that a metal oxide film formed of tungsten oxide can be formed on a surface of the tungsten film.

The amorphous semiconductor film 1305 is formed with a thickness of 25 to 200 nm (preferably, 30 to 150 nm) by a sputtering method, an LPCVD method, a plasma CVD method, or the like.

Next, the amorphous semiconductor film 1305 is crystallized by being irradiated with laser light. The amorphous semiconductor film 1305 may be crystallized by a method which combines laser light irradiation with a thermal crystallization method which employs RTA or an annealing furnace or a thermal crystallization method which employs a metal element for promoting crystallization, or the like. Subsequently, the obtained crystalline semiconductor film is etched into a desired shape to form crystallized crystalline semiconductor films 1305a to 1305f, and a gate insulating film 1306 is formed so as to cover the semiconductor films 1305a to 1305f (see FIG. 10B).

Note that the gate insulating film 1306 is formed using an insulating material such as silicon oxide, silicon nitride, silicon oxynitride (SiOxNy, where x>y>0), or silicon nitride oxide (SiNxOy, where x>y>0), by a CVD method, a sputtering method, or the like. For example, when the gate insulating film 1306 has a two-layer structure, preferably a silicon oxynitride film is formed as a first insulating film and a silicon nitride oxide film is formed as a second insulating film. Alternatively, a silicon oxide film may be formed as the first insulating film and a silicon nitride film may be formed as the second insulating film.

An example of a manufacturing step of the crystalline semiconductor films 1305a to 1305f is briefly described below. First, an amorphous semiconductor film with a film thickness of 50 to 60 nm is formed by a plasma CVD method. Next, a solution containing nickel, which is a metal element for promoting crystallization, is retained on the amorphous semiconductor film, and then dehydrogenation treatment (at 500° C., for one hour) and thermal crystallization treatment (at 550° C., for four hours) are performed on the amorphous semiconductor film to form a crystalline semiconductor film. Subsequently, the crystalline semiconductor film is irradiated with laser light, and the crystalline semiconductor films 1305a to 1305f are formed by using a photolithography method. Note that the amorphous semiconductor film may be crystallized just by laser light irradiation, without performing thermal crystallization which employs a metal element for promoting crystallization.

As a laser oscillator for crystallization, a continuous wave laser beam (a CW laser beam) or a pulsed wave laser beam (a pulsed laser beam) can be used. As a laser beam which can be used here, a laser beam emitted from one or more of the following can be used: a gas laser, such as an Ar laser, a Kr laser, or an excimer laser; a laser whose medium is single-crystal YAG YVO$_4$, forsterite (Mg$_2$SiO$_4$), YAlO$_3$, or GdVO$_4$, to which one or more of Nd, Yb, Cr, Ti, Ho, Er, Tm, and Ta has been added as a dopant; or polycrystalline (ceramic) YAG, Y$_2$O$_3$, YVO$_4$, YAlO$_3$, or GdVO$_4$, to which one or more of Nd, Yb, Cr, Ti, Ho, Er, Tm, and Ta has been added as a dopant; a glass laser; a ruby laser; an alexandrite laser; a Ti:sapphire laser; a copper vapor laser; or a gold vapor laser. Crystals with a large grain size can be obtained by irradiation with fundamental waves of such laser beams or second to fourth harmonics of the fundamental waves. For example, the second harmonic (532 nm) or the third harmonic (355 nm) of an Nd:YVO$_4$ laser (fundamental wave of 1064 nm) can be used. In this case, a power density of approximately 0.01 to 100 MW/cm$^2$ (preferably, 0.1 to 10 MW/cm$^2$) is necessary. Irradiation is conducted with a scanning rate of approximately 10 to 2000 cm/sec. Note that a laser using, as a medium, single-crystal YAG, YVO$_4$, forsterite (Mg$_2$SiO$_4$), YAlO$_3$, or GdVO$_4$, to which one or more of Nd, Yb, Cr, Ti, Ho, Er, Tm, and Ta has been added as a dopant, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, and Ta has been added as a dopant; an Ar ion laser; or a Ti:sapphire laser, can be continuously oscillated. Furthermore, pulse oscillation thereof can be performed at a repetition rate of 10 MHz or more by performing Q-switch operation, mode locking, or the like. When a laser beam is oscillated at a repetition rate of 10 MHz or more, during the time in which a semiconductor film melts by the laser beam and then solidifies, the semiconductor film is irradiated with a next pulse. Accordingly, unlike in a case of using a pulsed laser with a low repetition rate, a solid-liquid interface can be continuously moved in the semiconductor film; therefore, crystal grains which have grown continuously in a scanning direction can be obtained.

Further, the foregoing high-density plasma treatment may be performed on the semiconductor films 1305a to 1305f to oxidize or nitride surfaces thereof, to form the gate insulating film 1306. For example, the gate insulating film 1306 is formed by a plasma treatment in which a mixed gas which contains a rare gas such as He, Ar, Kr, or Xe, and oxygen, nitrogen oxide (NO$_2$), ammonia, nitrogen, hydrogen, or the like, is introduced. When excitation of the plasma in this case is performed by introduction of a microwave, high density plasma can be generated at a low electron temperature. The surface of the semiconductor film can be oxidized or nitrided by oxygen radicals (OH radicals may be included) or nitrogen radicals (NH radicals may be included) generated by this high-density plasma.

By treatment using such high-density plasma, an insulating film with a thickness of 1 to 20 nm, typically 5 to 10 nm, is formed over the semiconductor film. Because the reaction in this case is a solid-phase reaction, interface state density between the insulating film and the semiconductor film can be made very low. Because such high-density plasma treatment oxidizes (or nitrides) a semiconductor film (crystalline silicon, or polycrystalline silicon) directly, the insulating film can be formed with very little unevenness in its thickness. In addition, since crystal grain boundaries of crystalline silicon are also not strongly oxidized, very favorable conditions result. That is, by the solid-phase oxidation of the surface of the semiconductor film by the high-density plasma treatment shown here, an insulating film with good uniformity and low interface state density can be formed without excessive oxidation at crystal grain boundaries.

Note that as the gate insulating film 1906, just an insulating film formed by the high-density plasma treatment may be used, or an insulating film of silicon oxide, silicon oxynitride, silicon nitride, or the like may be formed thereover by a CVD method which employs plasma or a thermal reaction, to make stacked layers. In any case, when transistors include an insulating film formed by high-density plasma in a part of a gate insulating film or in the whole of a gate insulating film, unevenness in characteristics can be reduced.

Furthermore, in the semiconductor films 1305a to 1305f which are obtained by crystallizing a semiconductor film by irradiation with a continuous wave laser beam or a laser beam oscillated at a repetition rate of 10 MHz or more which is scanned in one direction, crystals grow in the scanning direction of the beam. When transistors are disposed so that the scanning direction is aligned with the channel length direction (the direction in which a carrier flows when a channel formation region is formed) and the above-described gate insulating layer is used in combination with the transistors, thin film transistors (TFTs) with less variation in characteristics and high electron field-effect mobility can be obtained.

Next, a first conductive film and a second conductive film are stacked over the gate insulating film 1306. In this embodiment mode, the first conductive film is formed with a thickness of 20 to 100 nm using a CVD method, a sputtering method, or the like. The second conductive film is formed with a thickness of 100 to 400 nm. The first conductive film and the second conductive film are formed using an element such as tantalum (Ta), tungsten (W), titanium (Ti), molybdenum (Mo), aluminum (Al), copper (Cu), chromium (Cr), or niobium (Nb), or using an alloy material or a compound material containing such an element as its main component. Alternatively, they are formed using a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Because tungsten and tantalum nitride have high heat resistance, heat treatment for thermal activation can be performed after the first conductive film and the second conductive film are formed. In addition, in the case of using a three-layer structure instead of a two-layer structure, a stacked-layer structure including a molybdenum film, an aluminum film, and a molybdenum film may be used.

Next, a resist mask is formed using a photolithography method, and etching treatment for forming a gate electrode and a gate line is conducted, forming gate electrodes 1307 over the semiconductor films 1305a to 1305f. In this embodiment mode, an example in which the gate electrodes 1307 have a stacked-layer structure which includes a first conductive film 1307a and a second conductive film 1307b is described.

Next, the gate electrodes 1307 are used as masks, and an impurity element imparting n-type conductivity is added to the semiconductor films 1305a to 1305f at a low concentration by an ion doping method or an ion implantation method. Subsequently, a resist mask is selectively formed by a photolithography method, and an impurity element imparting p-type conductivity is added at a high concentration to the semiconductor films 1305a to 1305f. As an impurity element which exhibits n-type conductivity, phosphorus (P), arsenic (As), or the like can be used. As an impurity element which exhibits p-type conductivity, boron (B), aluminum (Al), gallium (Ga), or the like can be used. Here, phosphorus (P) is used as an impurity element which imparts n-type conductivity, and is selectively introduced into the semiconductor films 1305a to 1305f such that they contain phosphorus (P) at a concentration of $1\times10^{15}$ to $1\times10^{19}/cm^3$. Thus, n-type impurity regions 1308 are formed. Further, boron (B) is used as an impurity element which imparts p-type conductivity, and is selectively introduced into the semiconductor films 1305c and 1305e such that they contain boron (B) at a concentration of $1\times10^{19}$ to $1\times10^{20}/cm^3$. Thus, p-type impurity regions 1309 are formed (see FIG. 10C).

Next, an insulating film is formed so as to cover the gate insulating film 1306 and the gate electrodes 1307. The insulating film is formed as a single layer or stacked layers of a film containing an inorganic material such as silicon, an oxide of silicon, or a nitride of silicon, or a film containing an organic material such as an organic resin, by a plasma CVD method, a sputtering method, or the like. Next, the insulating film is selectively etched using anisotropic etching which etches mainly in a vertical direction, forming insulating films 1310 (also referred to as side walls) which are in contact with side surfaces of the gate electrodes 1307. The insulating films 1310 are used as masks for doping when LDD (lightly doped drain) regions are formed.

Next, using a resist mask formed by a photolithography method, the gate electrodes 1307, and the insulating films 1310 as masks, an impurity element which imparts n-type conductivity is added at a high concentration to the semiconductor films 1305a, 1305b, 1305d, and 1305f, to form n-type impurity regions 1311. Here, phosphorus (P) is used as an impurity element which imparts n-type conductivity, and it is selectively introduced into the semiconductor films 1305a, 1305b, 1305d, and 1305f such that they contain phosphorus (P) at a concentration of $1\times10^{19}$ to $1\times10^{20}/cm^3$. Thus the n-type impurity regions 1311, which have a higher concentration than the impurity regions 1308, are formed.

By the foregoing steps, n-channel thin film transistors 1300a, 1300b, 1300d, and 1300f, and p-channel thin film transistors 1300c and 1300e are formed (see FIG. 10D).

In the n-channel thin film transistor 1300a, a channel formation region is formed in a region of the semiconductor film 1305a which overlaps with the gate electrode 1307; the impurity regions 1311 which each form either a source region or a drain region are formed in regions which do not overlap with the gate electrode 1307 and the insulating films 1310; and lightly doped drain regions (LDD regions) are formed in regions which overlap with the insulating films 1310 and which are between the channel formation region and the impurity regions 1311. Further, the n-channel thin film transistors 1300b, 1300d, and 1300f are similarly provided with channel formation regions, lightly doped drain regions, and impurity regions 1311.

In the p-channel thin film transistor 1300c, a channel formation region is formed in a region of the semiconductor film 1305c which overlaps with the gate electrode 1307, and the impurity regions 1309 which each form either a source region or a drain region are formed in regions which do not overlap with the gate electrode 1307. Further, the p-channel thin film transistor 1300e is similarly provided with a channel formation region and impurity regions 1309. Note that here, the p-channel thin film transistors 1300c and 1300e are not provided with LDD regions; however, the p-channel thin film transistors may be provided with an LDD region, and the n-channel thin film transistor is not necessarily provided with an LDD region.

Next, an insulating film is formed as a single layer or stacked layers so as to cover the semiconductor films 1305a to 1305f, the gate electrodes 1307, and the like; and conductive films 1313, which are electrically connected to the impurity regions 1309 and 1311 which form the source regions or the drain regions of the thin film transistors 1300a to 1300f, are formed over the insulating film (see FIG. 11A). The insulating film is formed as a single layer or stacked layers, using an inorganic material, such as an oxide of silicon or a nitride of silicon, an organic material, such as a polyimide, a polyamide, benzocyclobutene, an acrylic, or an epoxy, a siloxane material, or the like, by a CVD method, a sputtering method, an SOG method, a droplet discharge method, a screen printing method, or the like. Here, the insulating film has a two-layer structure. A silicon nitride oxide film is formed as a first insulating film 1312a, and a silicon oxynitride film is formed as a second insulating film 1312b. Further, the conductive films 1313 can form source electrodes and drain electrodes of the thin film transistors 1300a to 1300f.

Note that before the insulating films 1312a and 1312b are formed or after one or more thin films of the insulating films 1312a and 1312b are formed, heat treatment is preferably conducted for recovering the crystallinity of the semiconductor film, for activating an impurity element which has been added to the semiconductor film, or for hydrogenating the semiconductor film. As the heat treatment, thermal annealing, a laser annealing method, an RTA method, or the like is preferably used.

The conductive films 1313 are formed as a single layer or stacked layers, using any of the elements aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing one of the above-mentioned elements as its main component, by a CVD method, a sputtering method, or the like. An alloy material containing aluminum as its main component corresponds to, for example, a material which contains aluminum as its main component and also contains nickel, or an alloy material which contains aluminum as its main component and which also contains nickel and one or both of carbon and silicon. The conductive films 1313 preferably employ, for example, a stacked-layer structure including a barrier film, an aluminum-silicon (Al—Si) film, and a barrier film, or a stacked-layer structure including a barrier film, an aluminum-silicon (Al—Si) film, a titanium nitride film, and a barrier film. Note that a barrier film corresponds to a thin film formed from titanium, a nitride of titanium, molybdenum, or a nitride of molybdenum. Aluminum and aluminum silicon, which have low resistance and are inexpensive, are ideal materials for forming the conductive films 1313. Further, generation of a hillock of aluminum or aluminum silicon can be prevented when upper and lower barrier layers are formed. Furthermore, when the barrier film is formed from titanium, which is a highly-reducible element, even if a thin natural oxide film is formed over the crystalline semiconductor film, the natural oxide film is chemically reduced, so good contact with the crystalline semiconductor film can be obtained.

Next, an insulating film 1314 is formed so as to cover the conductive films 1313, and over the insulating film 1314, conductive films 1315a and 1315b, which are each electrically connected to the conductive films 1313 which form source electrodes and drain electrodes of the thin film transistors 1300a and 1300f, are formed. Further, a conductive film 1316, which are each electrically connected to the conductive films 1313 which form source electrodes and drain electrodes of the thin film transistors 1300b and 1300e, are formed. Note that the conductive films 1315a and 1315b may be formed of the same material at the same time as the conductive film 1316. The conductive films 1315a and 1315b and the conductive film 1316 can be formed using any of the materials that the conductive films 1313 can be formed of, mentioned above.

Subsequently, a conductive film 1317 that serves as an antenna is formed so as to be electrically connected to the conductive film 1316 (see FIG. 11B).

The insulating film 1314 can be provided by a CVD method, a sputtering method, or the like as a single-layer structure which includes an insulating film containing oxygen and/or nitrogen, such as silicon oxide (SiOx), silicon nitride (SiNx), silicon oxynitride (SiOxNy where x>y), or silicon nitride oxide (SiNxOy, where x>y); or a film containing carbon, such as DLC (diamond-like carbon); or an organic material, such as epoxy, polyimide, polyamide, polyvinyl phenol, benzocyclobutene, or acrylic; or a siloxane material, such as a siloxane resin. Alternatively, the insulating film may have a stacked structure including the above-mentioned materials. Note that a siloxane material corresponds to a material having a Si—O—Si bond. Siloxane has a backbone structure formed of bonds of silicon (Si) and oxygen (O). As a substituent, an organic group containing at least hydrogen (for example, an alkyl group or aromatic hydrocarbon) is used. A fluoro group can also be used as a substituent. Alternatively, an organic group containing at least hydrogen and a fluoro group may be used as a substituent.

The conductive film 1317 is formed from a conductive material, using a CVD method, a sputtering method, a printing method, such as a screen printing method or a gravure printing method, a droplet discharge method, a dispensing method, a plating method, or the like. The conductive material is any of the elements aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing one of the above-mentioned elements as its main component, and has a single-layer structure or a stacked-layer structure.

For example, in the case of using a screen printing method to form the conductive film 1317 which serves as an antenna, the conductive film 1317 can be provided by selectively printing a conductive paste in which conductive particles having a grain size of several nm to several tens of µm are dissolved or dispersed in an organic resin. As conductive particles, metal particles of one or more of any of silver (Ag), gold (Au), copper (Cu), nickel (Ni), platinum (Pt), palladium (Pd), tantalum (Ta), molybdenum (Mo), titanium (Ti), and the like; fine particles of silver halide; or dispersive nanoparticles can be used. In addition, as the organic resin included in the conductive paste, one or more organic resins selected from among organic resins which serve as a binder, a solvent, a dispersing agent, or a coating material for the metal particles can be used. An organic resin such as an epoxy resin or a silicon resin can be given as representative examples. Further, when the conductive film is formed, it is preferable to conduct baking after the conductive paste is applied. For example, in the case of using fine particles containing silver as a main component (e.g., the grain size is in the range of 1 nm to 100 nm, inclusive) as a material for the conductive paste, the conductive film can be obtained by curing by baking at a temperature in the range of 150 to 300° C. Alternatively, fine particles containing solder or lead-free solder as a main component may be used. In that case, preferably fine particles having a grain size of 20 µm or less are used. Solder and lead-free solder have advantages such as low cost.

Further, the conductive films 1315a and 1315b can each serve as a wiring which is electrically connected to a secondary battery included in a semiconductor device of the present invention in a subsequent process. Furthermore, when the conductive film 1317 which serves as an antenna is formed, another conductive film may be separately formed such that it is electrically connected to the conductive films 1315a and 1315b, and that conductive film may be used as a wiring connected to the secondary battery.

Next, an insulating film 1318 is formed so as to cover the conductive film 1317, and then a layer (hereinafter referred to as an element formation layer 1319) including the thin film transistors 1300a to 1300f, the conductive film 1317, and the like, is separated from the substrate 1301. Here, after using laser light (e.g., UV light) irradiation to form openings in regions where the thin film transistors 1300a to 1300f are not formed (see FIG. 11C), the element formation layer 1319 can be separated from the substrate 1301 using physical force. Alternatively, before the element formation layer 1319 is separated from the substrate 1301, an etchant may be introduced into the formed openings to selectively remove the separation layer 1303. As the etchant, a gas or liquid containing halogen fluoride or an interhalogen compound is used.

For example, chlorine trifluoride ($ClF_3$) is used as a gas containing halogen fluoride. Accordingly, the element formation layer 1319 is separated from the substrate 1301. Note that the separation layer 1303 may be partially left instead of being removed entirely. By leaving a part of the separation layer 1303, consumption of the etchant and treatment time required for removing the separation layer can be reduced. Further, the element formation layer 1319 can be left over the substrate 1301 after the separation layer 1303 is removed. Furthermore, by reusing the substrate 1301 after the element formation layer 1319 is separated from it, cost can be reduced.

The insulating film 1318 can be formed using a CVD method, a sputtering method, or the like as a single-layer structure including an insulating film which contains oxygen and/or nitrogen, such as silicon oxide (SiOx), silicon nitride (SiNx), silicon oxynitride (SiOxNy where x>y), or silicon nitride oxide (SiNxOy where x>y); or a film containing carbon, such as DLC (diamond-like carbon); or an organic material such as epoxy, polyimide, polyamide, polyvinyl phenol, benzocyclobutene, or acrylic; or a siloxane material such as a siloxane resin. Alternatively, the insulating film 1318 can have a stacked-layer structure including one or more of the above-mentioned films.

Figure 12A:
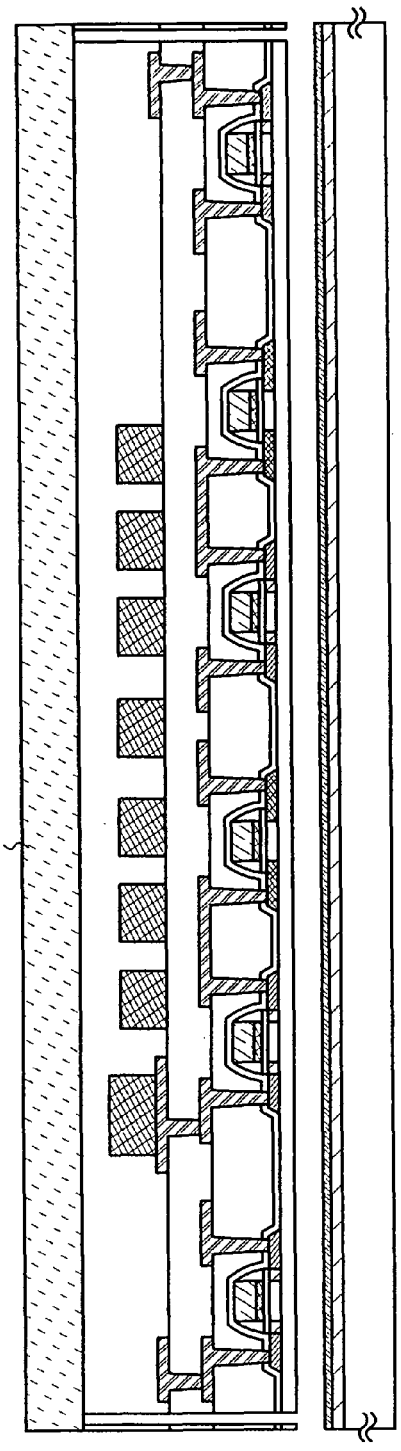
FIGS. 12A and 12B show an example of a manufacturing method of a semiconductor device of the present invention.

In this embodiment, the openings are formed in the element formation layer 1319 by laser light irradiation, and then a first sheet material 1320 is attached to one surface of the element formation layer 1319 (a surface where the insulating film 1318 is exposed). Then, the element formation layer 1319 is separated from the substrate 1301 (see FIG. 12A).

Figure 12B:
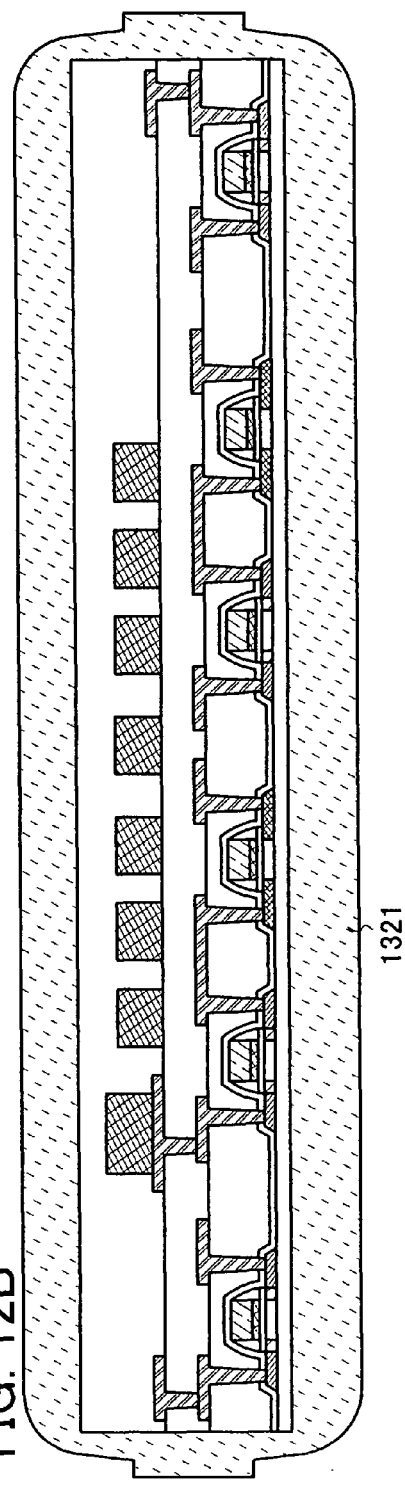

Next, after attaching a second sheet material 1321 to the other surface of the element formation layer 1319 (a surface exposed by separation), the first sheet material 1320 and the second sheet material 1321 are attached together by performing one or both of heat treatment and pressure treatment (see FIG. 12B). As the first sheet material 1320 and the second sheet material 1321, a hot-melt film or the like can be used.

As the first sheet material 1320 and the second sheet material 1321, films on which antistatic treatment for preventing static electricity or the like has been performed (hereinafter referred to as antistatic films) can be used. Examples of antistatic films are films in which a material that can prevent electrostatic charge is dispersed in a resin, films to which a material that can prevent electrostatic charge is attached, and the like. A film provided with a material that can prevent electrostatic charge may be a film which has a material that can prevent electrostatic charge provided over one of its surfaces, or a film which has a material that can prevent electrostatic charge provided over both of its surfaces. Concerning the film which has a material that can prevent electrostatic charge provided over one of its surfaces, the film may be attached to the layer such that the material that can prevent electrostatic charge is on the inner side of the film or the outer side of the film. Note that the material that can prevent electrostatic charge may be provided over an entire surface of the film, or over a part of the film. As a material that can prevent electrostatic charge, a metal, indium tin oxide (ITO), or a surfactant such as an amphoteric surfactant, a cationic surfactant, or a nonionic surfactant can be used. In addition to that, as an antistatic material, a resin material containing a cross-linked copolymer having a carboxyl group and a quaternary ammonium base on its side chain, or the like can be used. By attaching, mixing, or applying such a material to a film, an antistatic film can be formed. By performing sealing using the antistatic film, the extent to which a semiconductor element is affected by static electricity from outside and the like when dealt with as a product can be reduced.

Note that a storage capacity of a power supply circuit is formed such that a thin film secondary battery is connected to the conductive films 1315a and 1315b. The connection with the secondary battery may be made before the element formation layer 1319 is separated from the substrate 1301 (at a stage shown in FIG. 11B or FIG. 11C), or after the element formation layer 1319 is separated from the substrate 1301 (at a stage shown in FIG. 12A), or after the element formation layer 1319 is sealed with the first sheet material and the second sheet material (at a stage shown in FIG. 12B). An example in which the element formation layer 1319 and the secondary battery are formed such that they are connected to each other is described below with reference to FIGS. 13A to 14B.

In FIG. 11B, conductive films 1331a and 1331b, which are electrically connected to the conductive films 1315a and 1315b, respectively, are formed at the same time as the conductive film 1317 which serves as an antenna. Next, the insulating film 1318 is formed so as to cover the conductive film 1317 and the conductive films 1331a and 1331b. Then, openings 1332a and 1332b are formed so as to expose surfaces of the conductive films 1331a and 1331b. Subsequently, after openings are formed in the element formation layer 1319 by laser light irradiation, the first sheet material 1320 is attached to one surface of the element formation layer 1319 (the surface where the insulating film 1318 is exposed); and then, the element formation layer 1319 is separated from the substrate 1301 (see FIG. 13A).

Next, the second sheet material 1333 is attached to the other surface (a surface exposed by separation) of the element formation layer 1319, and the element formation layer 1319 is then separated from the first sheet material 1320. Accordingly, in this embodiment mode, a sheet material with weak adhesion is used as the first sheet material 1320. Then, conductive films 1334a and 1334b, which are electrically connected to the conductive films 1331a and 1331b, respectively, through the openings 1332a and 1332b, are selectively formed (see FIG. 13B).

The conductive film 1334a and the conductive film 1334b are formed of a conductive material, using a CVD method, a sputtering method, a printing method such as a screen printing method or a gravure printing method, a droplet discharge method, a dispensing method, a plating method, or the like. The conductive material is any of the elements aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing one of the above-mentioned elements as its main component, and has a single-layer structure or a stacked-layer structure.

Note that in this embodiment mode, an example in which the conductive films 1334a and 1334b are formed after the element formation layer 1319 is separated from the substrate 1301 is described; however, the element formation layer 1319 may be separated from the substrate 1301 after the conductive films 1334a and 1334b are formed.

Next, in the case where a plurality of elements are formed over the substrate, the element formation layer 1319 is separated into separate elements (see FIG. 14A). A laser irradiation apparatus, a dicing apparatus, a scribing apparatus, or the like can be used for the separation. Here, the plurality of elements formed over one substrate are separated from one another by laser light irradiation.

Subsequently, the separated elements are electrically connected to the secondary battery (see FIG. 14B). In this embodiment, a thin film secondary battery is used for the storage capacity of the power supply circuit, and the following thin films are sequentially stacked: a current-collecting thin film, a negative electrode active material layer, a solid electrolyte layer, a positive electrode active material layer, and a current-collecting thin film.

A conductive film 1336a and a conductive film 1336b are each formed of a conductive material by a CVD method; a sputtering method; a printing method such as screen-printing or gravure printing; a droplet discharging method, a dispenser method, or a plating method. The conductive material is formed in a single-layer structure or a stacked-layer structure from an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or compound material mainly containing the element. The conductive material is desired to have good adhesion to a negative electrode active material and have little resistance. Aluminum, copper, nickel, vanadium, or the like is particularly preferable as the conductive material.

To describe in detail the structure of the thin film secondary battery, a negative electrode active material layer 1381 is formed over the conductive film 1336a. In general, vanadium oxide ($V_2O_5$) or the like is used. Next, a solid electrolyte layer 1382 is formed over the negative electrode active material layer 1381. In general, lithium phosphate ($Li_3PO_4$) or the like is used. Then, a positive electrode active material layer 1383 is formed over the solid electrolyte layer 1382. In general, lithium manganate ($LiMn_2O_4$) or the like is used. Alternatively, lithium cobaltate ($LiCoO_2$) or lithium nickelate ($LiNiO_2$) may be used. Next, a current-collecting thin film 1384 that becomes an electrode is formed over the positive electrode active material layer 1383. The current-collecting thin film 1384 is desired to have good adhesion to the positive electrode active material layer 1383 and have little resistance. Aluminum, copper, nickel, vanadium, or the like can be used as the current-collecting thin film 1384.

Each of the foregoing thin film layers, that is, the negative electrode active material layer 1381, the solid electrolyte layer 1382, the positive electrode active material layer 1383, and the current-collecting thin film 1384, may be formed using a sputtering technique or an evaporation technique. The thickness of each layer is desirably 1 to 3 μm.

Next, a resin is applied to form an interlayer film 1385. Then, the interlayer film is etched to form a contact hole. The interlayer film is not limited to being formed of a resin, and the interlayer film may be another film such as a CVD oxide film; however, a resin is desirable in terms of flatness. Alternatively, the contact hole may be formed without etching, using a photosensitive resin. Subsequently, by forming a wiring layer 1386 over the interlayer film and connecting to the conductive film 1334b, electrical connection with the secondary battery is secured.

Here, the conductive films 1334a and 1334b provided over the element formation layer 1319 are connected to the conductive films 1336a and 1336b that in advance serve as connecting terminals of the thin film secondary battery 1389, respectively. A case is shown in which the conductive film 1334a and the conductive film 1336a, or the conductive film 1334b and the conductive film 1336b, are pressure-bonded to each other with a material having an adhesive property such as an anisotropic conductive film (ACF) or an anisotropic conductive paste (ACP) interposed therebetween, so that they are electrically connected to each other. An example is shown in which conductive particles 1338 contained in a resin 1337 having an adhesive property are used for connection. Alternatively, connection can be performed using a conductive adhesive agent such as a silver paste, a copper paste, or a carbon paste, or using solder bonding, or the like.

Note that a structure of a transistor can be of various modes, and is not limited to the specific structure described in this embodiment. For example, a multi-gate structure in which there are two or more gate electrodes may be used. In a multi-gate structure, channel regions are serially connected; accordingly, the structure is that in which a plurality of transistors are serially connected. By having a multi-gate structure, off-current is reduced and withstand voltage of the transistors is improved for favorable reliability, and even if voltage between the drain and the source changes when operating in a saturated region, current between the drain and the source does not change very much and a flat characteristic or the like can be obtained. In addition, the structure may be that in which a gate electrode is placed over and under a channel. With a structure in which a gate electrode is placed over and under the channel, the channel region increases; accordingly, a current value can be made to be large and a depletion layer is easily formed, thereby improving an S-value. When the gate electrodes are placed over and under the channel, the structure is like that in which a plurality of transistors are serially connected.

Alternatively, the structure may be that in which a gate electrode is placed over the channel, a structure in which a gate electrode is placed under the channel, a staggered structure, or an inversely staggered structure. Further alternatively, the structure may be that in which a channel region is divided into a plurality of regions, a structure in which channel regions are connected in parallel, or a structure in which channel regions are serially connected. Further, a source electrode or a drain electrode may overlap with the channel (or a portion thereof). By having a structure in which the source electrode or drain electrode overlaps with the channel (or a portion thereof), unstable operation due to accumulation of charge in a portion of the channel can be prevented. Further, there may also be an LDD region. By providing an LDD region, off-current is reduced and withstand voltage of the transistors is improved for favorable reliability, and even if voltage between the drain and the source changes when operating in a saturated region, current between the drain and the source does not change very much and a flat characteristic or the like can be obtained.

Note that a manufacturing method of the semiconductor device of this embodiment can be applied to the semiconductor device described in this specification. That is, this embodiment can provide a semiconductor device equipped with a clock generating circuit that can suppress variation of an oscillation frequency from the clock generating circuit, which is due to a change in the output voltage according to a discharging characteristic of the battery, and effectively utilize the remaining power of the battery. Accordingly, the lifetime of the battery can be lengthened without causing degradation in quality of an electronic appliance due to variation in a clock signal.

In addition, the semiconductor device of this embodiment equipped with the clock generating circuit of the present invention can generate a clock signal with little variation, without providing a constant-voltage circuit such as a regulator circuit in an input portion of the clock generating circuit. Accordingly, for the semiconductor device equipped with the clock generating circuit of the present invention, reduction in power consumption and miniaturization of the semiconductor device can be achieved.

Embodiment 2

In this embodiment, an example of a manufacturing method of the semiconductor device described in the above embodiment mode will be described with reference to drawings. In this embodiment, a structure in which an antenna, a battery, and a signal processing circuit of the semiconductor device are provided over the same substrate is described. Note that, using a transistor for which a channel-forming region is formed on a single-crystal substrate, the semiconductor is formed by forming together the antenna, a battery, and the signal processing circuit over the substrate. Using a transistor formed over a single-crystal substrate is favorable since the semiconductor device can be composed of a transistor with little variation in transistor characteristic. For the battery, an example using the thin film secondary battery described in foregoing Embodiment 1 will be described.

First, regions 2304 and 2306 separating an element (hereinafter simply referred to as regions 2304 and 2306) are formed in a semiconductor substrate 2300 (see FIG. 15A). The regions 2304 and 2306 provided in the semiconductor substrate 2300 are separated from each other by an insulating film (also referred to as a field oxide film 2302). The example shown herein is the case where a single-crystal Si substrate having n-type conductivity is used as the semiconductor substrate 2300, and a p-well 2307 is formed in the region 2306 of the semiconductor substrate 2300.

Any substrate can be used as the semiconductor substrate 2300 as long as it is a semiconductor. For example, a single-crystal Si substrate having n-type or p-type conductivity, a compound semiconductor substrate (e.g., a GaAs substrate, an InP substrate, a GaN substrate, a SiC substrate, a sapphire substrate, or a ZnSe substrate), a SOI (Silicon on Insulator) substrate formed by using a bonding method or a SIMOX (Separation by IMplanted OXygen), or the like can be used.

The regions 2304 and 2306 can be formed by a selective oxidation (LOCOS: LOCal Oxidation of Silicon) method, a trench isolation method, or the like.

In addition, the p-well formed in the region 2306 of the semiconductor substrate 2300 can be formed by selectively introducing a p-type impurity element in the semiconductor substrate 2300. As a p-type impurity element, boron (B), aluminum (Al), gallium (Ga), or the like can be used.

In this embodiment, although an impurity element is not introduced to the region 2304 because an n-type semiconductor substrate is used as the semiconductor substrate 2300, an n-well may be formed in the region 2304 by introducing an n-type impurity element. As an n-type impurity element, phosphorus (P), arsenic (As), or the like can be used. When a p-type semiconductor substrate is used, on the other hand, a structure may be employed in which an n-type impurity element is introduced to the region 2304 to form an n-well, whereas an impurity element is not introduced to the region 2306.

Next, insulating films 2332 and 2334 are formed so as to cover the regions 2304 and 2306, respectively (see FIG. 15B).

The insulating films 2332 and 2334 can be formed by, for example, forming silicon oxide films by oxidizing the surfaces of the regions 2304 and 2306 by thermal treatment. Alternatively, the insulating films 2332 and 2334 can be formed to have a stacked structure of a silicon oxide film and a film containing oxygen and nitrogen (a silicon oxynitride film) by conducting the steps of forming a silicon oxide film by a thermal oxidation method and then nitriding the surface of the silicon oxide film by nitridation treatment.

Further alternatively, the insulating films 2332 and 2334 can be formed by using plasma treatment as described above. For example, the insulating films 2332 and 2334 can be formed using a silicon oxide ($SiO_x$) film or a silicon nitride ($SiN_x$) film which is obtained by performing high-density-plasma oxidation or nitridation treatment on the surfaces of the regions 2304 and 2304 provided in the semiconductor substrate 2300. Further, after performing high-density-plasma oxidation treatment on the surfaces of the regions 2304 and 2306, high-density-plasma nitridation treatment may be conducted. In that case, silicon oxide films are formed on the surfaces of the regions 2304 and 2306 and then silicon oxynitride films are formed on the silicon oxide films. Thus, the insulating films 2332 and 2334 are each formed to have a stacked structure of the silicon oxide film and the silicon oxynitride film. In addition, it is also possible to conduct the steps of forming silicon oxide films on the surfaces of the regions 2304 and 2306 by a thermal oxidation method, and then performing high-density-plasma oxidation or nitridation treatment on the silicon oxide films.

The insulating films 2332 and 2334 formed over the regions 2304 and 2306 of the semiconductor substrate 2300 function as the gate insulating films of transistors which are completed later.

Next, a conductive film is formed so as to cover the insulating films 2332 and 2334 which are formed over the regions 2304 and 2306 (see FIG. 15C). Here, an example is shown where conductive films 2336 and 2338 are sequentially stacked as the conductive film. Needless to say, the conductive film may be formed to have a single layer or a stacked structure of more than two layers.

As a material of the conductive films 2336 and 2338, an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component can be used. Alternatively, a metal nitride film obtained by nitriding the above element can also be used. Further, a semiconductor material typified by polycrystalline silicon doped with an impurity element such as phosphorus can also be used.

Here, a stacked structure is employed in which the conductive film 2336 is formed using tantalum nitride and the conductive film 2338 is formed thereover using tungsten. Alternatively, it is also possible to form the conductive film 2336 using a single-layer film or a stacked film of tungsten nitride, molybdenum nitride, and/or titanium nitride and form the conductive film 2338 using a single-layer film or a stacked film of tantalum, molybdenum, and/or titanium.

Figure 16A:
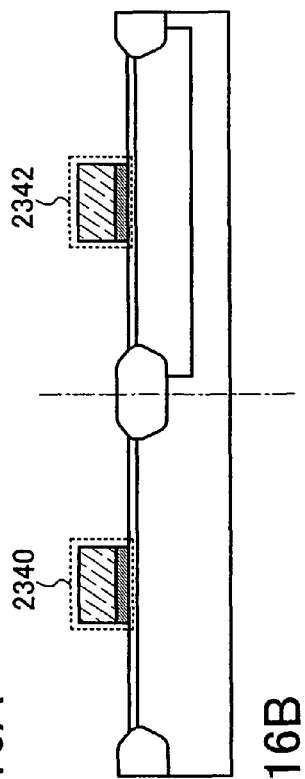
FIGS. 16A to 16C show an example of a manufacturing method of a semiconductor device of the present invention.

Next, the stacked conductive films 2336 and 2338 are selectively removed by etching, so that the conductive films 2336 and 2338 partially remain above the regions 2304 and 2306, respectively. Thus, gate electrodes 2340 and 2342 are formed (see FIG. 16A).

Figure 16B:
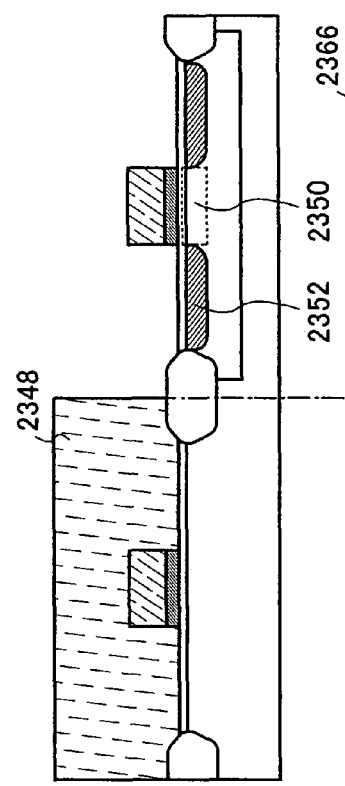

Next, a resist mask 2348 is selectively formed so as to cover the region 2304, and an impurity element is introduced to the region 2306 using the resist mask 2348 and the gate electrode 2342 as masks, whereby impurity regions are formed (see FIG. 16B). As an impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used as the impurity element.

In FIG. 16B, with the impurity element introduced, impurity regions 2352 which form source and drain regions and a channel formation region 2350 are formed in the region 2306.

Figure 16C:
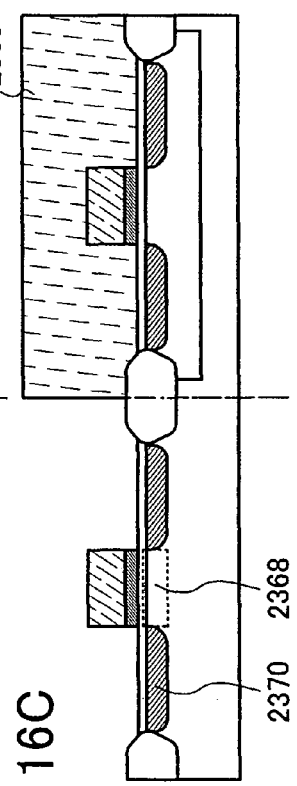

Next, a resist mask 2366 is selectively formed so as to cover the region 2306, and an impurity element is introduced to the region 2304 using the resist mask 2366 and the gate electrode 2340 as masks, whereby impurity regions are formed (see FIG. 16C). As the impurity element, an n-type impurity region or a p-type impurity region is used. As an n-type impurity element, phosphorus (P), arsenic (As), or the like can be used. As a p-type impurity element, boron (B), aluminum (Al), gallium (Ga), or the like can be used. Here, an impurity element (e.g., boron (B)) of a conductivity type opposite to that of the impurity element which has been introduced into the region 2306 in FIG. 16C is used. As a result, impurity regions 2370 which form source and drain regions and a channel formation region 2368 are formed in the region 2304.

Next, a second insulating film 2372 is formed so as to cover the insulating films 2332 and 2334 and the gate electrodes 2340 and 2342. Then, wirings 2374, which are electrically connected to the impurity regions 2352 and 2370 formed in the regions 2340 and 2360, are formed over the second insulating film 2372 (see FIG. 17A).

The second insulating film 2372 can be formed either in a single layer or in stacked layers, using an insulating film containing oxygen or nitrogen such as silicon oxide ($SiO_x$), silicon nitride ($SiN_x$), silicon oxynitride ($SiO_xN_y$ where x>y), or silicon nitride oxide ($SiN_xO_y$ where x>y); a film containing carbon such as DLC (Diamond-Like Carbon); an organic material such as epoxy, polyimide, polyamide, polyvinyl phenol, benzocyclobutene, or acrylic; a siloxane material containing a siloxane resin; or the like. Note that a siloxane material corresponds to a material having the bond of Si—O—Si. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used.

The wirings 2374 are formed either in a single layer or stacked layers of an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as a main component. An alloy material containing aluminum as a main component corresponds to, for example, a material which contains aluminum as a main component and also contains nickel, or a material which contains aluminum as a main component and also contains nickel and one or both of carbon and silicon. The wirings 2374 are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. Note that "barrier film" corresponds to a thin film made of titanium, titanium nitride, molybdenum, or molybdenum nitride. Aluminum and aluminum silicon, which have high resistance values and are inexpensive, are the most suitable material for forming the wirings 2374. When barrier layers are provided in the top layer and the bottom layer, generation of hillocks of aluminum or aluminum silicon can be prevented. When a barrier film made of titanium which is an element having a high reducing property is formed, even when there is a thin natural oxide film formed on the crystalline semiconductor film, the natural oxide film can be chemically reduced, and a favorable contact between the wirings 2374 and the crystalline semiconductor film can be obtained.

Note that the structure of the transistor of the invention is not limited to the one shown in the drawings. For example, a transistor with an inversely staggered structure, a fin FET structure, or the like can be used. A fin FET structure is advantageous in that it can suppress a short channel effect which would occur with the reduction of transistor size.

Further, in the semiconductor device of the present invention, a battery in which power can be accumulated is provided in the signal processing circuit. As the battery, it is preferable to use a capacitor such as an electrical double layer capacitor or a thin film secondary battery. In this embodiment, a connection between a transistor manufactured in this embodiment and a thin film secondary battery is described.

In this embodiment, the secondary battery is stacked and formed over the wirings 2374, which are connected to a transistor. For the secondary battery, a current-collecting thin film, a negative electrode active material layer, a solid electrolyte layer, a positive electrode active material layer, and a current-collecting thin film are sequentially stacked (FIG. 17B). Accordingly, a material of the wirings 2374, which doubles as a material for the current-collecting thin film of the secondary battery, is desired to have good adhesion to the negative electrode active material and have little resistance, and aluminum, copper, nickel, vanadium, or the like is particularly preferable as the material.

To describe in detail the structure of the thin film secondary battery, a negative electrode active material layer 2391 is formed over the wirings 2374. In general, vanadium oxide ($V_2O_5$) or the like is used. Next, a solid electrolyte layer 2392 is formed over the negative electrode active material layer 2391. In general, lithium phosphate ($Li_3PO_4$) or the like is used. Then, a positive electrode active material layer 2393 is formed over the solid electrolyte layer 2392. In general, lithium manganate ($LiMn_2O_4$) or the like is used. Alternatively, lithium cobaltate ($LiCoO_2$) or lithium nickelate ($LiNiO_2$) may be used. Next, a current-collecting thin film 2394 that becomes an electrode is formed over the positive electrode active material layer 2393. The current-collecting thin film 2394 is desired to have good adhesion to the positive electrode active material layer 2393 and have little resistance. Aluminum, copper, nickel, vanadium, or the like can be used as the current-collecting thin film 2394.

Each of the foregoing thin film layers, that is, the negative electrode active material layer 2391, the solid electrolyte layer 2392, the positive electrode active material layer 2393, and the current-collecting thin film 2394, may be formed using a sputtering technique or an evaporation technique. Further, the thickness of each layer is desirably 1 to 3 μm.

Next, a resin is applied to form an interlayer film 2396. Then, the interlayer film 2396 is etched to form a contact hole. The resin for the interlayer film is not limited, and may be another film such as a CVD oxide film; however, a resin is desirable in terms of flatness. Alternatively, the contact hole may be formed without etching, using a photosensitive resin. Subsequently, by forming a wiring layer 2395 over the interlayer film 2396 and connecting to a conductive film 2397, electrical connection of the secondary battery is secured.

With such a structure as the foregoing structure, the semiconductor device of the present invention can have a structure in which a transistor is formed over a single-crystal substrate and a thin film secondary battery is provided thereover. Accordingly, in the semiconductor device of the present invention, ultra-thinness, miniaturization, and flexibility can be achieved.

Note that the manufacturing method of the semiconductor device of this embodiment can be applied to the semiconductor devices of other embodiment modes described in this specification. That is, this embodiment can provide a semiconductor device equipped with a clock generating circuit that can suppress variation of an oscillation frequency from the clock generating circuit, which is due to a change in the output voltage according to a discharging characteristic of the battery, and effectively utilize the remaining power of the battery. Accordingly, lifetime of the battery can be lengthened without causing degradation in quality of an electronic appliance due to variation in a clock signal.

In addition, the semiconductor device of this embodiment equipped with the clock generating circuit of the present invention can generate a clock signal with little variation, without providing a constant-voltage circuit such as a regulator circuit in an input portion of the clock generating circuit. Accordingly, for the semiconductor device equipped with the clock generating circuit of the present invention, reduction in power consumption and miniaturization of the semiconductor device can be achieved.

Embodiment 3

In this embodiment, an example of a manufacturing method of a semiconductor device that is different from that of foregoing Embodiment 2 is described with reference to drawings.

First, an insulating film is formed over a substrate 2600. Here, a single-crystal Si having n-type conductivity is used as the substrate 2600, and insulating films 2602 and 2604 are formed over the substrate 2600 (see FIG. 18A). For example, silicon oxide ($SiO_x$) is formed as the insulating film 2602 by performing thermal treatment on the substrate 2600, and then silicon nitride ($SiN_x$) is formed over the insulating film 2602 by a CVD method.

Any substrate can be used as the substrate 2600 as long as it is a semiconductor substrate. For example, a single-crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon on Insulator) substrate formed by using a bonding method or a SIMOX (Separation by IMplanted OXygen), or the like can be used.

Alternatively, after forming the insulating film 2602, the insulating film 2604 may be formed by nitriding the insulating film 2602 by high-density-plasma treatment. Note that the insulating film provided over the substrate 2600 may have either a single-layer structure or a stacked structure of three or more layers.

Next, patterns of a resist mask 2606 are selectively formed over the insulating film 2604, and selective etching is conducted using the resist mask 2606 as a mask, whereby recessed portions 2608 are selectively formed in the substrate 2600 (see FIG. 18B). For the etching of the substrate 2600 and the insulating films 2602 and 2604, plasma dry etching can be used.

Next, the patterns of the resist mask 2606 are removed, and then an insulating film 2610 is formed so as to fill the recessed portions 2608 formed in the substrate 2600 (see FIG. 18C).

The insulating film 2610 is formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. Here, a silicon oxide film is formed by an atmospheric pressure CVD method or a low-pressure CVD method using a TEOS (tetraethyl orthosilicate) gas.

Figure 19A:
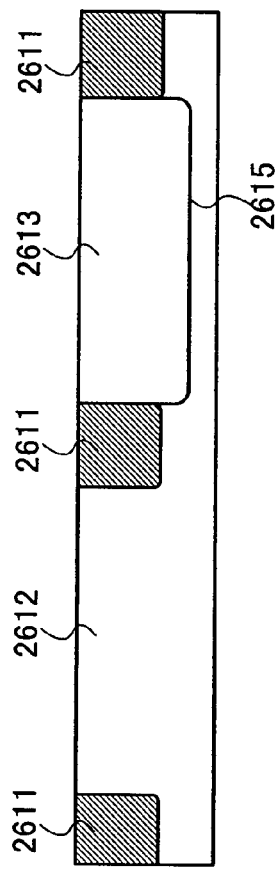
FIGS. 19A to 19C show an example of a manufacturing method of a semiconductor device of the present invention.

Next, the surface of the substrate 2600 is exposed by grinding, polishing, or CMP (Chemical Mechanical Polishing). Here, by exposing the surface of the substrate 2600, regions 2612 and 2613 are formed between insulating films 2611 which are formed in the recessed portions 2608 of the substrate 2600. Note that the insulating films 2611 are obtained by partially removing the insulating film 2610 formed over the surface of the substrate 2600 by grinding, polishing, or CMP. Subsequently, by selectively introducing a p-type impurity element, a p-well 2615 is formed in the region 2613 of the substrate 2600 (see FIG. 19A).

As a p-type impurity element, boron (B), aluminum (Al), gallium (Ga), or the like can be used. Here, boron (B) is introduced into the region 2613 and the region 2614 as the impurity element.

In this embodiment, although an impurity element is not introduced to the region 2612 because an n-type semiconductor substrate is used as the substrate 2600, an n-well may be formed in the region 2612 by introducing an n-type impurity element. As an n-type impurity element, phosphorus (P), arsenic (As), or the like can be used.

When a p-type semiconductor substrate is used, on the other hand, a structure may be used in which an n-type impurity element is introduced to the region 2612 to form an n-well, whereas an impurity element is not introduced to the region 2613 and the region 2614.

Figure 19B:
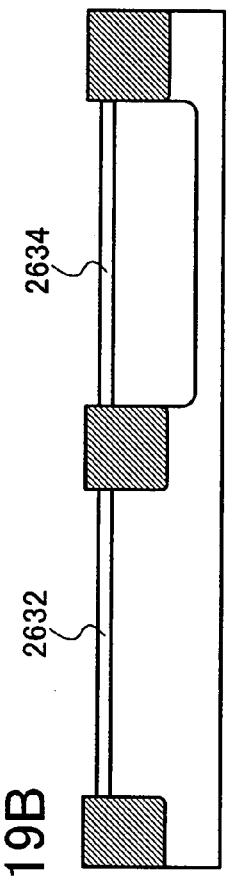

Next, insulating films 2632 and 2634 are formed over the surfaces of the regions 2612 and 2613 in the substrate 2600, respectively (see FIG. 19B).

The insulating films 2632 and 2634 can be formed by, for example, oxidizing the surfaces of the regions 2612 and 2613 provided in the substrate 2600 by thermal treatment. Alternatively, the insulating films 2632 and 2634 can be formed to have a stacked structure of a silicon oxide film and a film containing oxygen and nitrogen (a silicon oxynitride film) by conducting the steps of forming a silicon oxide film by a thermal oxidation method and then nitriding the surface of the silicon oxide film by nitridation treatment.

Further alternatively, the insulating films 2632 and 2634 can be formed by using plasma treatment as described above. For example, the insulating films 2632 and 2634 can be formed using a silicon oxide ($SiO_x$) film or a silicon nitride ($SiN_x$) film which is obtained by performing high-density-plasma oxidation or nitridation treatment on the surfaces of the regions 2612 and 2613 provided in the substrate 2600. Further, after performing high-density-plasma oxidation treatment on the surfaces of the regions 2612 and 2613, high-density-plasma nitridation treatment may be conducted. In that case, silicon oxide films are formed on the surfaces of the regions 2612 and 2613 and then silicon oxynitride films are formed on the silicon oxide films. Thus, the insulating films 2632 and 2634 are each formed to have a stacked structure of the silicon oxide film and the silicon oxynitride film. In addition, it is also possible to conduct the steps of forming silicon oxide films on the surfaces of the regions 2612 and 2613 by a thermal oxidation method, and then performing high-density-plasma oxidation or nitridation treatment on the silicon oxide films.

Note that the insulating films 2632 and 2634 that are formed in the regions 2612 and 2613 of the substrate 2600 function as the gate insulating films of transistors which are completed later.

Figure 19C:
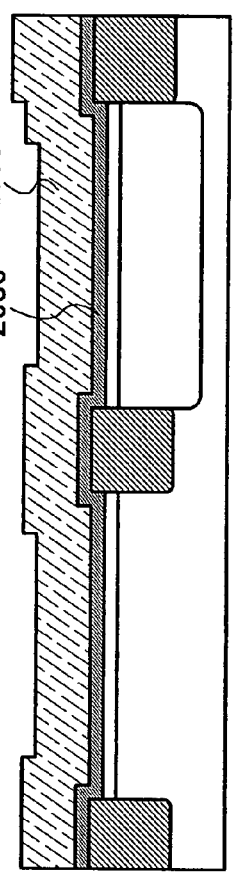

Next, a conductive film is formed so as to cover the insulating films 2632 and 2634 which are formed over the regions 2612 and 2613 provided in the substrate 2600 (see FIG. 19C). Here, an example is shown where conductive films 2636 and 2638 are sequentially stacked as the conductive film. Needless to say, the conductive film may be formed to have a single layer or a stacked structure of more than two layers.

As a material of the conductive films 2636 and 2638, an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component can be used. Alternatively, a metal nitride film obtained by nitriding the above element can also be used. Further, a semiconductor material typified by polycrystalline silicon doped with an impurity element such as phosphorus can also be used.

Here, a stacked structure is employed in which the conductive film 2636 is formed using tantalum nitride and the conductive film 2638 is formed thereover using tungsten. Alternatively, it is also possible to form the conductive film 2636 using a single-layer film or a stacked film of tantalum nitride, tungsten nitride, molybdenum nitride, and/or titanium nitride and form the conductive film 2638 using a single-layer film or a stacked film of tungsten, tantalum, molybdenum, and/or titanium.

Figure 20A:
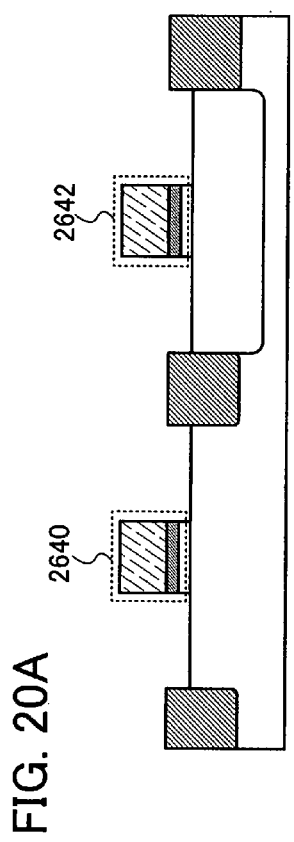
FIGS. 20A to 20C show an example of a manufacturing method of a semiconductor device of the present invention.

Next, the stacked conductive films 2636 and 2638 are selectively removed by etching, so that the conductive films 2636 and 2638 partially remain above the regions 2612 and 2613 of the substrate 2600. Thus, conductive films 2640 and 3642 functioning as gate electrodes are formed (see FIG. 20A). Here, a part of the regions 2612 and 2613 of the substrate 2600 which does not overlap with the conductive films 2640 and 2642 is exposed at its surface.

Specifically, a part of the insulating film 2632 formed over the region 2612 of the substrate 2600, which does not overlap with the conductive film 2640, is selectively removed, so that the ends of the conductive film 2640 and the ends of the insulating film 2632 approximately correspond to each other. In addition, a part of the insulating film 2634 formed over the region 2614 of the substrate 2600, which does not overlap with the conductive film 2642, is selectively removed, so that the ends of the conductive film 2642 and the ends of the insulating film 2634 approximately correspond to each other.

In this case, the part of the insulating films which do not overlap with the conductive films 2640 and 2642 may be removed at the same time as the formation of the conductive films 2640 and 2642. Alternatively, the part of the insulating films which do not overlap with the conductive films 2640 and 2642 may be removed by using resist masks which are left after forming the conductive films 2640 and 2642 as masks, or by using the conductive films 2640 and 2642 as masks.

Figure 20B:
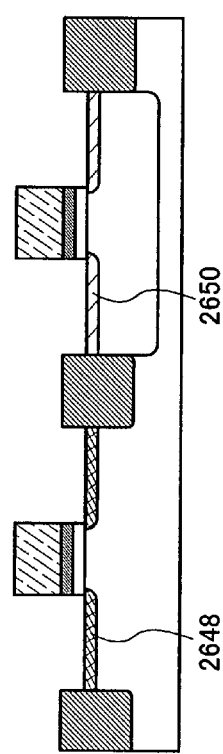

Then, an impurity element is selectively introduced to the regions 2612 and 2613 of the substrate 2600 (see FIG. 20B). Here, an n-type impurity element is selectively introduced to the region 2613 at a low concentration, using the conductive film 2642 as a mask, whereas a p-type impurity element is selectively introduced to the region 2612 at a low concentration, using the conductive film 2640 as a mask. As an n-type impurity element, phosphorus (P), arsenic (As), or the like can be used. As a p-type impurity element, boron (B), aluminum (Al), gallium (Ga), or the like can be used.

Next, sidewalls 2654 having a contact with the side surfaces of the conductive films 2640 and 2642 are formed. Specifically, a film containing an inorganic material such as silicon, silicon oxide, or silicon nitride, or a film containing an organic material such as an organic resin is formed in a single layer or in stacked layers. Then, the insulating film is selectively etched by anisotropic etching (mainly in the perpendicular direction), so that the sidewalls 2654 can be formed so as to be in contact with the side surfaces of the conductive films 2640 and 2642. The sidewalls 2654 are used as doping masks for forming LDD (Lightly Doped Drain) regions. In addition, the sidewalls 2654 are formed to be in contact with the sides of insulating films and floating gate electrodes which are formed below the conductive films 2640 and 2642.

Figure 20C:
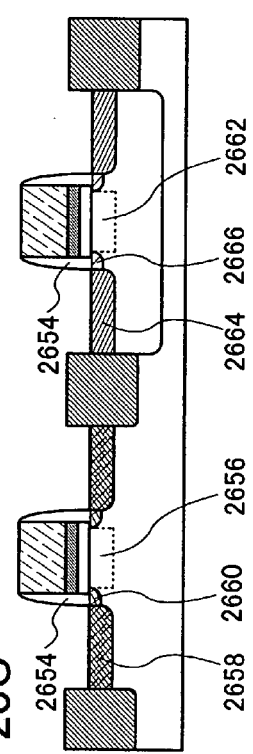

Next, by introducing an impurity element to the regions 2612 and 2613 of the substrate 2600, using the sidewalls 2654 and the conductive films 2640 and 2642 as masks, impurity regions which function as source and drain regions are formed (see FIG. 20C). Here, an n-type impurity element is introduced to the region 2613 of the substrate 2600 at a high concentration, using the sidewalls 2654 and the conductive film 2642 as masks, whereas a p-type impurity element is introduced to the region 2612 at a high concentration, using the sidewalls 2654 and the conductive film 2640 as masks.

As a result, impurity regions 2658 which form source and drain regions, low concentration impurity regions 2660 which form LDD regions, and a channel formation region 2656 are formed in the region 2612 of the substrate 2600. Meanwhile, impurity regions 2664 which form source and drain regions, low concentration impurity regions 2666 which form LDD regions, and a channel formation region 2662 are formed in the region 2613 of the substrate 2600.

Note that in this embodiment, the impurity elements are introduced with the condition that a part of the regions 2612 and 2613 of the substrate 2600 which does overlap with the conductive films 2640 and 2642 is exposed. Accordingly, the channel formation regions 2656 and 2662 which are formed in the regions 2612 and 2613 of the substrate 2600 respectively can be formed in a self-aligned manner with respect to the conductive films 2640 and 2642.

Figure 21A:
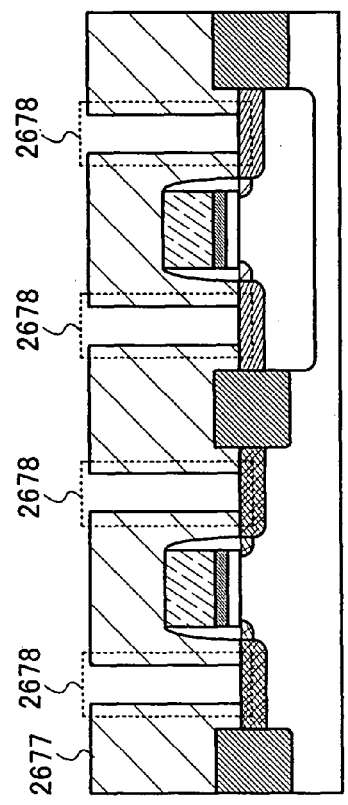
FIGS. 21A and 21B show an example of a manufacturing method of a semiconductor device of the present invention.

Next, a second insulating film 2677 is formed so as to cover the insulating films, the conductive films, and the like which are provided over the regions 2612 and 2613 of the substrate 2600, and openings 2678 are formed in the second insulating film 2677 (see FIG. 21A).

The second insulating film 2677 can be formed either in a single layer or in stacked layers, using an insulating film containing oxygen or nitrogen such as silicon oxide ($SiO_x$), silicon nitride ($SiN_x$), silicon oxynitride ($SiO_xN_y$ where x>y), or silicon nitride oxide ($SiN_xO_y$ where x>y); a film containing carbon such as DLC (Diamond-Like Carbon); an organic material such as epoxy, polyimide, polyamide, polyvinyl phenol, benzocyclobutene, or acrylic; a siloxane material containing a siloxane resin; or the like. Note that a siloxane material corresponds to a material having the bond of Si—O—Si. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent.

Next, conductive films 2680 are formed in the openings 2678 by a CVD method. Then, conductive films 2682a to 2682d (the conductive film 2682d is also referred to as a "wiring 2682d") are selectively formed over the insulating film 2677 so as to be electrically connected to the conductive films 2680 (see FIG. 21B).

The conductive films 2680 and 2682a to 2682d are formed either in a single layer or stacked layers of an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as a main component. An alloy material containing aluminum as a main component corresponds to, for example, a material which contains aluminum as a main component and also contains nickel, or a material which contains aluminum as a main component and also contains nickel and one or both of carbon and silicon. Each of the conductive films 2680 and 2682 to 2682d is preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. Note that "barrier film" corresponds to a thin film made of titanium, titanium nitride, molybdenum, or molybdenum nitride. Aluminum and aluminum silicon, which have high resistance values and are inexpensive, are the most suitable material for forming the conductive film 2680. When barrier layers are provided in the top layer and the bottom layer, generation of hillocks of aluminum or aluminum silicon can be prevented. When a barrier film made of titanium which is an element having a high reducing property is formed, even when there is a thin natural oxide film formed on the crystalline semiconductor film, the natural oxide film can be chemically reduced, and a favorable contact between the conductive film 2680 and the crystalline semiconductor film can be obtained. Here, the conductive film 2680 can be formed by selectively growing tungsten (W) by a CVD method.

Through the above steps, a P-channel transistor formed in the region 2612 of the substrate 2600 and an N-channel transistor formed in the region 2613 of the substrate 2600 can be obtained.

Note that the structure of the transistor forming the semiconductor device of the invention is not limited to the one shown in the drawings. For example, a transistor with an inversely staggered structure, a fin FET structure, or the like can be used. A fin FET structure is advantageous in that it can suppress a short channel effect which would occur with the reduction of transistor size.

Further, in the semiconductor device of the present invention, a battery in which power can be accumulated is provided in the signal processing circuit. As the battery, it is preferable to use an electrical double layer capacitor or a thin film secondary battery. In this embodiment, a connection between a transistor manufactured in this embodiment and a thin film secondary battery is described.

Figure 21B:
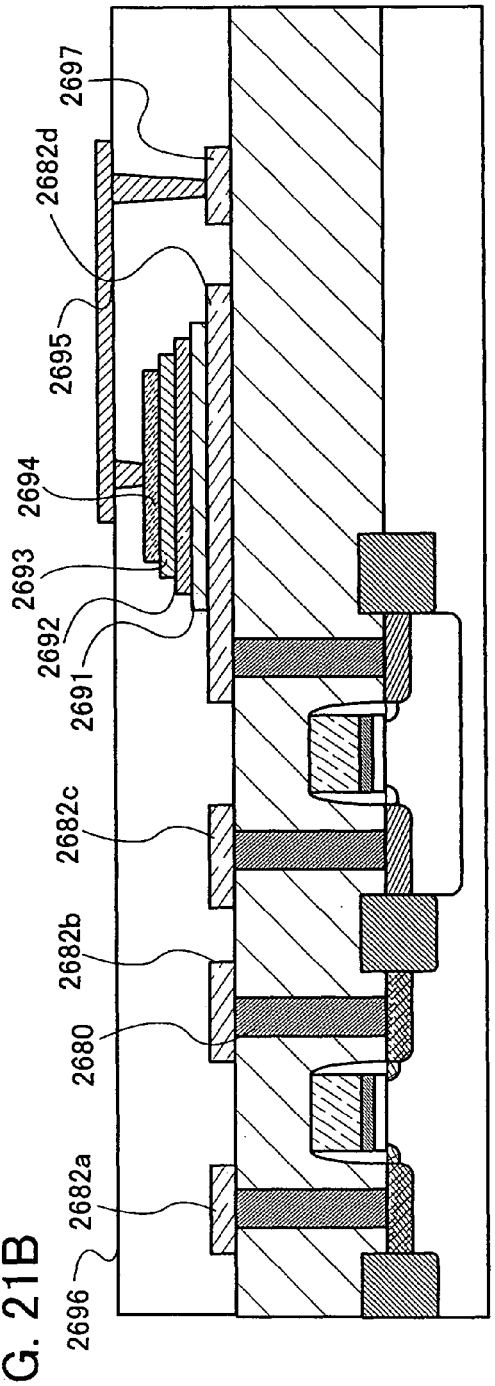
Figure 23A:
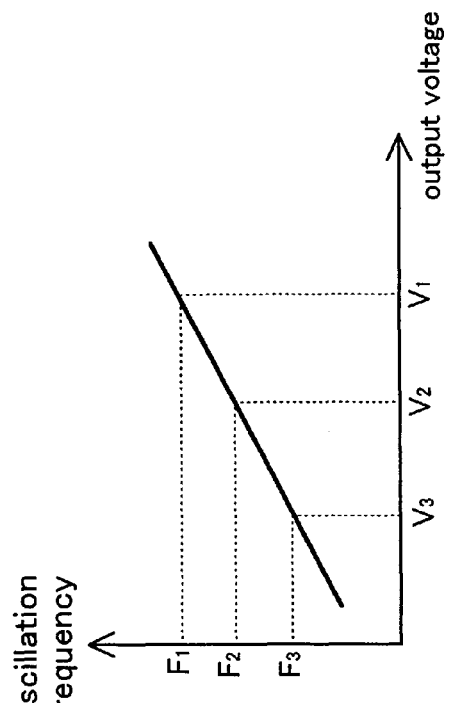
FIGS. 23A and 23B each describe a problem that is solved by the present invention.
Figure 23B:
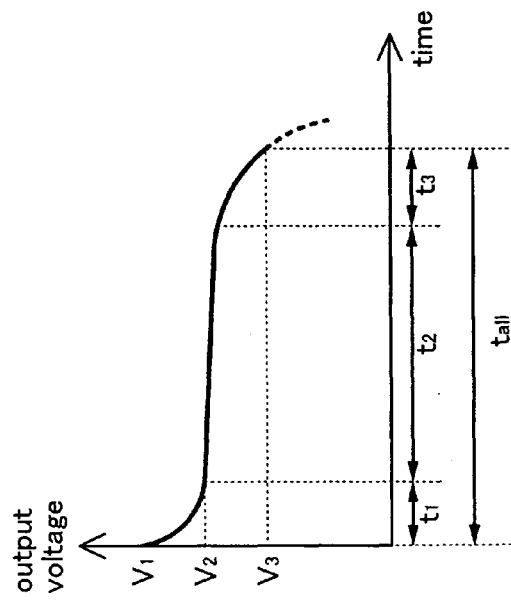

In this embodiment, the secondary battery is stacked and formed over the wiring 2682d, which are connected to a transistor. For the secondary battery, a current-collecting thin film, a negative electrode active material layer, a solid electrolyte layer, a positive electrode active material layer, and a current-collecting thin film are sequentially stacked (FIG. 21B). Accordingly, a material of the wiring 2682d, which doubles as a material for the current-collecting thin film of the secondary battery, is desired to have good adhesion to the negative electrode active material and have little resistance, and aluminum, copper, nickel, vanadium, or the like is particularly preferable as the material.

To describe in detail the structure of the thin film secondary battery, a negative electrode active material layer 2691 is formed over the wiring 2682d. In general, vanadium oxide ($V_2O_5$) or the like is used. Next, a solid electrolyte layer 2692 is formed over the negative electrode active material layer 2691. In general, lithium phosphate ($Li_3PO_4$) or the like is used. Then, a positive electrode active material layer 2693 is formed over the solid electrolyte layer 2692. In general, lithium manganate ($LiMn_2O_4$) or the like is used. Alternatively, lithium cobaltate ($LiCoO_2$) or lithium nickelate ($LiNiO_2$) may be used. Next, a current-collecting thin film 2694 that becomes an electrode is formed over the positive electrode active material layer 2693. The current-collecting thin film 2694 is desired to have good adhesion to the positive electrode active material layer 2693 and have little resistance. Aluminum, copper, nickel, vanadium, or the like can be used as the current-collecting thin film 2694.

Each of the foregoing thin film layers, that is, the negative electrode active material layer 2691, the solid electrolyte layer 2692, the positive electrode active material layer 2693, and the current-collecting thin film 2694, may be formed by using a sputtering technique or an evaporation technique. Further, the thickness of each layer is desirably 1 to 3 μm.

Next, a resin is applied to form an interlayer film 2696. Then, the interlayer film 2696 is etched to form a contact hole. The resin for the interlayer film 2696 is not limited, and may be another film such as a CVD oxide film; however, a resin is desirable in terms of flatness. Alternatively, the contact hole may be formed without etching, using a photosensitive resin. Subsequently, by forming a wiring layer 2695 over the interlayer film 2696 and connecting to a conductive film 2697, electrical connection of the thin film secondary battery is secured.

With such a structure as the foregoing structure, the semiconductor device of the present invention can have a structure in which a transistor is formed over a single-crystal substrate and a thin film secondary battery is provided thereover. Accordingly, in the semiconductor device of the present invention, ultra-thinness, miniaturization, and flexibility can be achieved.

Note that the manufacturing method of the semiconductor device of this embodiment can be applied to the semiconductor devices of other embodiment modes described in this specification. That is, this embodiment can provide a semiconductor device equipped with a clock generating circuit that can suppress variation of an oscillation frequency from the clock generating circuit, which is due to a change in the output voltage according to a discharging characteristic of the battery, and effectively utilize the remaining power of the battery. Accordingly, lifetime of the battery can be lengthened without causing degradation in quality of an electronic appliance due to variation in a clock signal.

In addition, the semiconductor device of this embodiment equipped with the clock generating circuit of the present invention can generate a clock signal with little variation, without providing a constant-voltage circuit such as a regulator circuit in an input portion of the clock generating circuit. Accordingly, for the semiconductor device equipped with the clock generating circuit of the present invention, reduction in power consumption and miniaturization of the semiconductor device can be achieved.

Embodiment 4

In this embodiment, uses of an RF tag, which is an example of a usage mode of a semiconductor device equipped with a clock generating circuit of the present invention described in the foregoing embodiment modes, will be described. An RF tag can be included in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, human bodies, clothing, everyday articles, products such as electronic appliances, identification tags on luggage, and the like. An RF tag can be used as a so-called ID label, ID tag, or ID card. An electronic appliance refers to a liquid crystal display device, an EL display device, a television set (also called simply a television, a TV receiver, or a television receiver), a mobile phone, or the like. Below, applications of the invention and examples of products which include an application of the invention are described with reference to FIGS. 22A to 22E.

FIG. 22A shows examples of completed RF tags relating to the invention. A plurality of ID labels 3003 each including an RF tag 3002 are formed on a label board 3001 (separate paper). The ID labels 3003 are stored in a box 3004. Further, on the ID label 3003, there is information about a product or service (a product name, a brand, a trademark, a trademark owner, a seller, a manufacturer, or the like). Meanwhile, an ID number that is unique to the product (or the type of product) is assigned to the included RF tag, so that forgery, infringement of intellectual property rights such as patent rights and trademark rights, and illegal behavior such as unfair competition can easily be detected. In addition, a large amount of information that cannot be clearly shown on a container of the product or the label (for example, production area, selling area, quality, raw materials, efficacy, use, quantity, shape, price, production method, method of use, time of production, time of use, expiration date, instructions for the product, information about the intellectual property of the product, or the like) can be input to the RF tag so that a client or a consumer can access the information using a simple reader. Further, the RF tag is structured such that the producer of a product can easily rewrite or erase, for example, the information, but a client or a consumer cannot. Note that a structure where the RF tag has a display portion and can display the information may be employed.

FIG. 22B shows a label-shaped RF tag 3011 which includes an RF tag 3012. By providing a product with the RF tag 3011, management of the product can be simplified. For example, in a case where the product is stolen, the product can be traced, so the culprit can be identified quickly. Thus, by providing the RF tag, products that are superior in so-called traceability can be distributed.

FIG. 22C shows an example of a completed ID card 3021 including an RF tag 3022. The ID card 3021 may be any kind of card: a cash card, a credit card, a prepaid card, an electronic ticket, electronic money, a telephone card, a membership card, or the like. Further, a structure in which a display portion is provided on a surface of the ID card 3021 and various information is displayed may be employed.

FIG. 22D shows a completed bearer bond 3031. An RF tag 3032 is embedded in the bearer bond 3031 and is protected by a resin which forms the periphery of the RF tag. Here, the resin is filled with a filler. The bearer bond 3031 can be formed in the same manner as an RF tag of the invention. Note that the aforementioned bearer bond may be a stamp, a ticket, an admission ticket, a merchandise coupon, a book coupon, a stationery coupon, a beer coupon, a rice coupon, various types of gift coupon, various types of service coupon, or the like. Needless to say, the bearer bond is not limited thereto. Further, when the RF tag 3032 of the invention is provided in bills, coins, securities, bearer bonds, documents, or the like, an authentication function can be provided, and by using the authentication function, forgery can be prevented.

FIG. 22E shows a book 3043 to which an ID label 3041 which includes an RF tag 3042 is attached. The RF tag 3042 of the invention is firmly attached in or on goods by being attached to a surface or embedded, for example. As shown in FIG. 22E, the RF tag 3042 can be embedded in the paper of a book, or embedded in an organic resin of a package. Because the RF tag 3042 of the invention can be small, thin, and lightweight, it can be firmly attached to or in goods without spoiling their design.

Further, although the efficiency of a system such as an inspection system can be improved by providing the RF tag of the invention in, for example, packaging containers, storage media, personal belongings, foods, clothing, everyday articles, electronic appliances, or the like. Furthermore, by providing the RF tag on or in a vehicle, counterfeit and theft can be prevented. Living things such as animals can be easily identified by implanting the individual living things with RF tags. For example, year of birth, sex, breed, and the like can be easily discerned by implanting wireless tags in living things such as domestic animals.

Note that the semiconductor device equipped with the clock generating circuit of the present invention can be utilized for various products other than the foregoing products. By the semiconductor device described in this embodiment being equipped with the clock generating circuit of the present invention, a semiconductor device can be provided, which is equipped with a clock generating circuit that can suppress variation of an oscillation frequency from the clock generating circuit, which is due to a change in the output voltage according to a discharging characteristic of the battery, and effectively utilize the remaining power of the battery. Accordingly, lifetime of the battery can be lengthened without causing degradation in quality of an electronic appliance due to variation in a clock signal.

In addition, the semiconductor device of this embodiment equipped with the clock generating circuit of the present invention can generate a clock signal with little variation, without providing a constant-voltage circuit such as a regulator circuit in an input portion of the clock generating circuit. Accordingly, for the semiconductor device equipped with the clock generating circuit of the present invention, reduction in power consumption and miniaturization of the semiconductor device can be achieved.

This application is based on Japanese Patent Application serial no. 2006-323948 filed with Japan Patent Office on Nov. 30, 2006, the entire contents of which are hereby incorporated by reference.

What is claimed is:

1. A clock generating circuit comprising:
   an output voltage detecting circuit for detecting an output voltage from a battery;
   a frequency-division number determining circuit for determining the number of frequency-division by a value of the output voltage detected by the output voltage detecting circuit;
   an oscillation circuit for outputting a reference clock signal depending on the output voltage;
   a counter circuit for counting a number of waves of the reference clock signal; and
   a frequency-dividing circuit that frequency-divides the reference clock signal
   wherein the counter circuit outputs a signal for performing a frequency-division with the number of frequency-division determined by the frequency-division number determining circuit when the counted number of waves reaches a number of waves corresponding to the number of frequency-division after the counter circuit outputs a signal for performing a frequency-division once.

2. The clock generating circuit according to claim 1, wherein the battery is a primary battery or a secondary battery.

3. The clock generating circuit according to claim 1, wherein the oscillation circuit is a ring oscillator or a crystal oscillator.

4. A clock generating circuit comprising:
   an output voltage detecting circuit for detecting an output voltage from a battery;
   a frequency-division number determining circuit for determining the number of frequency-division by a value of the output voltage detected by the output voltage detecting circuit;
   an oscillation circuit for outputting a reference clock signal depending on the output voltage;
   a counter circuit for counting a number of waves of the reference clock signal; and a frequency-dividing circuit that outputs a signal, which is the reference clock signal that is frequency-divided, as a clock signal, to a logic circuit, wherein the counter circuit outputs a signal for performing a frequency-division with the number of frequency-division determined by the frequency-division number determining circuit when the counted number of waves reaches a number of waves corresponding to the number of frequency-division after the counter circuit outputs a signal for performing a frequency-division once.

5. The clock generating circuit according to claim 4, wherein the battery is a primary battery or a secondary battery.

6. The clock generating circuit according to claim 4, wherein the oscillation circuit is a ring oscillator or a crystal oscillator.

7. A semiconductor device equipped with an antenna and performs transmission and reception of a signal by wireless communication with a reader/writer comprising:

a clock generating circuit;
a logic circuit; and
a battery,
wherein the clock generating circuit includes:
an output voltage detecting circuit for detecting an output voltage from a battery;
a frequency-division number determining circuit for determining the number of frequency-division by a value of the output voltage detected by the output voltage detecting circuit;
an oscillation circuit for outputting a reference clock signal depending on the output voltage;
a counter circuit for counting a number of waves of the reference clock signal; and
a frequency-dividing circuit that frequency-divides the reference clock signal,
wherein the counter circuit outputs a signal for performing a frequency-division with the number of frequency-division determined by the frequency-division number determining circuit when the counted number of waves reaches a number of waves corresponding to the number of frequency-division after the counter circuit outputs a signal for performing a frequency-division once.

8. The semiconductor device according to claim 7, wherein the battery is a primary battery or a secondary battery.

9. The semiconductor device according to claim 7, wherein the oscillation circuit is a ring oscillator or a crystal oscillator.

10. A semiconductor device equipped with an antenna and performs transmission and reception of a signal by wireless communication with a reader/writer comprising:

a clock generating circuit;
a logic circuit; and
a battery,
wherein the clock generating circuit includes:
an output voltage detecting circuit for detecting an output voltage from a battery;
a frequency-division number determining circuit for determining the number of frequency-division by a value of the output voltage detected by the output voltage detecting circuit;
an oscillation circuit for outputting a reference clock signal depending on the output voltage;
a counter circuit for counting a number of waves of the reference clock signal; and
a frequency-dividing circuit that outputs a signal, which is the reference clock signal that is frequency-divided, as a clock signal, to a logic circuit,
wherein the counter circuit outputs a signal for performing a frequency-division with the number of frequency-division determined by the frequency-division number determining circuit when the counted number of waves reaches a number of waves corresponding to the number of frequency-division after the counter circuit outputs a signal for performing a frequency-division once.

11. The semiconductor device according to claim 10, wherein the battery is a primary battery or a secondary battery.

12. The semiconductor device according to claim 10, wherein the oscillation circuit is a ring oscillator or a crystal oscillator.

* * * * *